(12) United States Patent
Kato et al.

(10) Patent No.: US 9,062,373 B2
(45) Date of Patent: Jun. 23, 2015

(54) FILM DEPOSITION APPARATUS

(75) Inventors: Hitoshi Kato, Iwate (JP); Shigehiro Ushikubo, Iwate (JP); Katsuyuki Hishiya, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 539 days.

(21) Appl. No.: 13/571,546

(22) Filed: Aug. 10, 2012

(65) Prior Publication Data

US 2013/0042813 A1   Feb. 21, 2013

(30) Foreign Application Priority Data

Aug. 17, 2011   (JP) .................................. 2011-178422

(51) Int. Cl.
    *C23C 16/44*       (2006.01)
    *C23C 16/455*      (2006.01)
    *H01L 21/02*       (2006.01)

(52) U.S. Cl.
    CPC ....... *C23C 16/4412* (2013.01); *H01L 21/02164* (2013.01); *H01L 21/02211* (2013.01); *H01L 21/0228* (2013.01); *C23C 16/45551* (2013.01); *C23C 16/45578* (2013.01)

(58) Field of Classification Search
    CPC ............ C23C 16/455; C23C 16/45548; C23C 16/4412
    USPC ......................................................... 118/719
    See application file for complete search history.

(56) References Cited

U.S. PATENT DOCUMENTS

2011/0039026 A1   2/2011   Kato et al.

FOREIGN PATENT DOCUMENTS

| CN | 101994101 | 3/2011 |
|----|-----------|--------|
| JP | S64-057712 | 3/1989 |
| JP | 01-249694 | 10/1989 |
| JP | 2010-239102 | 10/2010 |
| JP | 2011-040574 | 2/2011 |
| JP | 2011-135004 | 7/2011 |

*Primary Examiner* — Keath Chen
(74) *Attorney, Agent, or Firm* — IPUSA, PLLC

(57) ABSTRACT

A film deposition apparatus includes a turntable including plural substrate placing areas in the circumferential direction; a gas nozzle provided to extend from an inner edge to an outer edge of the substrate placing area; a gas evacuation port provided outside of an outer edge of the turntable and downstream in a rotational direction of the turntable with respect to the gas nozzle for evacuating the gas; and a regulation member including a wall portion provided between the gas nozzle and the gas evacuation port for isolating the gas nozzle and the gas evacuation port at least at a part between the inner edge to the outer edge of the substrate placing area while having a space extending from the inner edge to the outer edge of the substrate placing area when a substrate is placed on the substrate placing area.

13 Claims, 36 Drawing Sheets

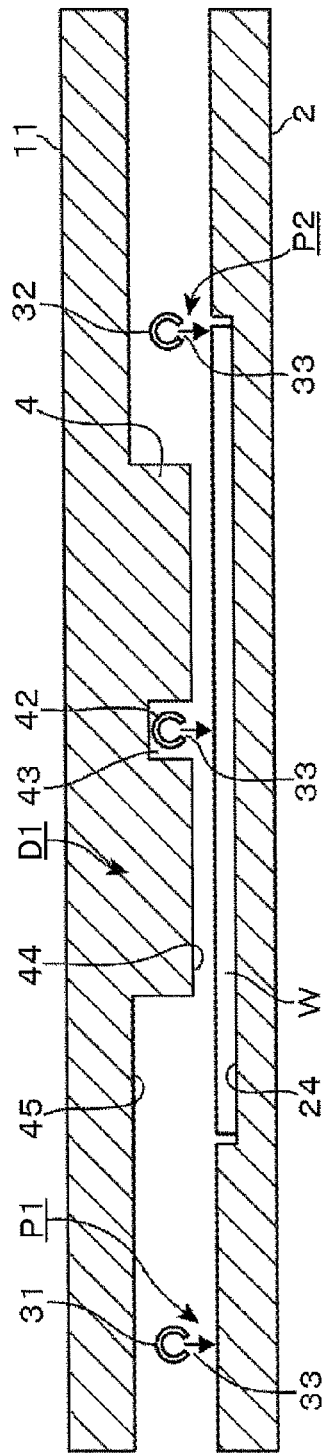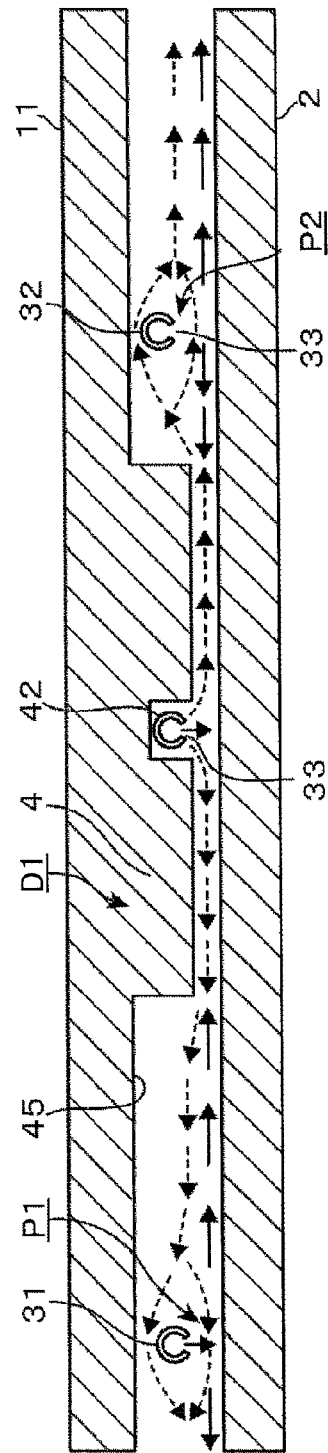

FILM DEPOSITION APPARATUS

CROSS-REFERENCE TO RELATED APPLICATION

The present application is based on Japanese Priority Application No. 2011-178422 filed on Aug. 17, 2011, the entire contents of which are hereby incorporated by reference.

BACKGROUND OF THE INVENTION

1. Field of the Invention

The present invention relates to a film deposition apparatus.

2. Description of the Related Art

Atomic Layer Deposition (ALD) is known as a method of forming a thin film such as a silicon oxide film ($SfO_2$) on a substrate such as a semiconductor wafer (simply referred to as a "wafer" hereinafter). By ALD, plural kinds of process gasses (reaction gasses) which react with each other are supplied in order onto a substrate to form a film as a reaction product.

Patent Document 1 and Patent Document 2 disclose a film deposition apparatus that performs ALD. In such a film deposition apparatus, plural substrates are placed on a turntable, which is provided in a vacuum chamber, in the circumferential direction. Then, a first process gas and a second process gas are respectively supplied from a first process gas nozzle and a second process gas nozzle onto the substrates in order while rotating the turntable. Here, a first processing area and a second processing area are provided below the first process gas nozzle and the second process gas nozzle, respectively. Further, separation areas are provided between the first processing area and the second processing area by flowing separation gas. Further, gas evacuation ports are respectively provided for the first processing area and the second processing area at a circumference of the turntable for evacuating gasses in the vacuum chamber.

In the first processing area and the second processing area, the first process gas and the second process gas flow toward the gas evacuation ports with the separation gas, respectively. With this structure, mixing of the first process gas and the second process gas can be suppressed.

In Patent Document 3, an apparatus in which plural wafers are placed in the circumferential direction on a horizontal table, which is capable of being rotated, is disclosed. In the apparatus, a gas evacuating pipe is provided at a periphery of a gas supplying pipe to evacuate a carrier gas and an excess reaction gas from the gas evacuating pipe.

Present inventors have been further examining a structure by which a film with a high in-plane uniformity is formed.

PATENT DOCUMENT

[Patent Document 1] Japanese Laid-open Patent Publication No. 2010-239102
[Patent Document 2] Japanese Laid-open Patent Publication No. 2011-40574
[Patent Document 3] Japanese Laid-open Patent Publication No. H01-249694 (FIG. 7)

SUMMARY OF THE INVENTION

The present invention is made in light of the above problems, and provides a technique capable of forming a film with a high in-plane uniformity.

According to an embodiment, there is provided a film deposition apparatus in which a gas is supplied onto a substrate in a vacuum chamber to form a film on the substrate, including, a turntable provided in the vacuum chamber, including plural substrate placing areas formed at a surface of the turntable for placing substrates in the circumferential direction of the turntable configured to be rotated to rotate the substrate placing areas; a gas nozzle provided to extend from an inner edge to an outer edge of the substrate placing area, and provided with plural gas supplying ports along a longitudinal direction of the gas nozzle for supplying gas; a gas evacuation port provided outside of an outer edge of the turntable and downstream in a rotational direction of the turntable with respect to the gas nozzle for evacuating the gas; and a regulation member including a wall portion provided between the gas nozzle and the gas evacuation port and isolating the gas nozzle and the gas evacuation port at least at a part between the inner edge to the outer edge of the substrate placing area while having a space extending from the inner edge to the outer edge of the substrate placing area even when a substrate is placed on the substrate placing area.

BRIEF DESCRIPTION OF THE DRAWINGS

Other objects, features and advantages of the present invention will become more apparent from the following detailed description when read in conjunction with the accompanying drawings.

FIG. 4A and FIG. 4B are cross-sectional views of the film deposition apparatus for explaining processing areas and a separation area;

FIG. 22 is a graph showing results of example 1 and relative example 1a;

FIG. 23 is a graph showing results of example 1 and relative example 1a;

DETAILED DESCRIPTION OF THE PREFERRED EMBODIMENTS

Figure 1:
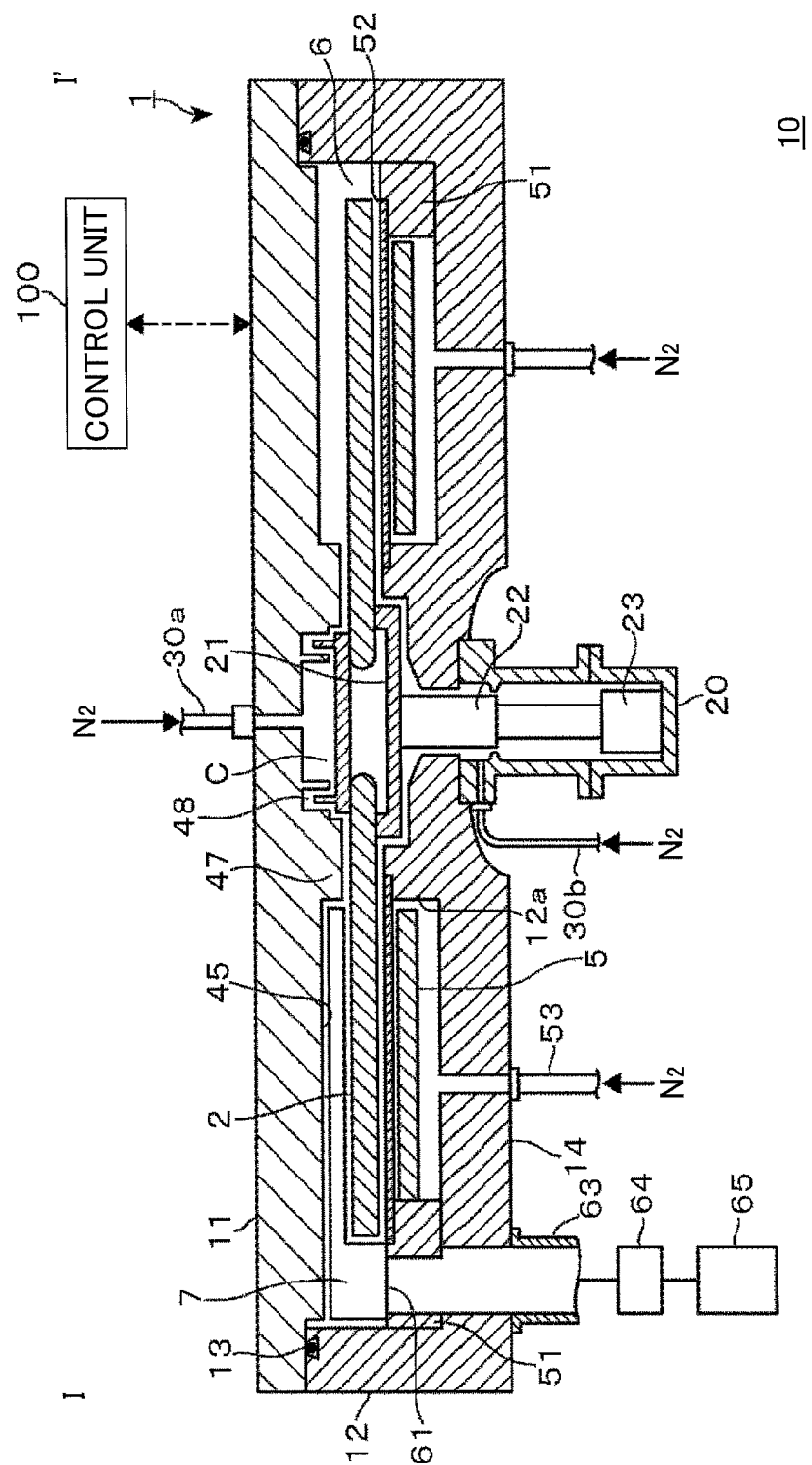
FIG. 1 is a cross-sectional view of a film deposition apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment

In this embodiment, an example where a regulation member is an evacuation duct is explained.

Figure 2:
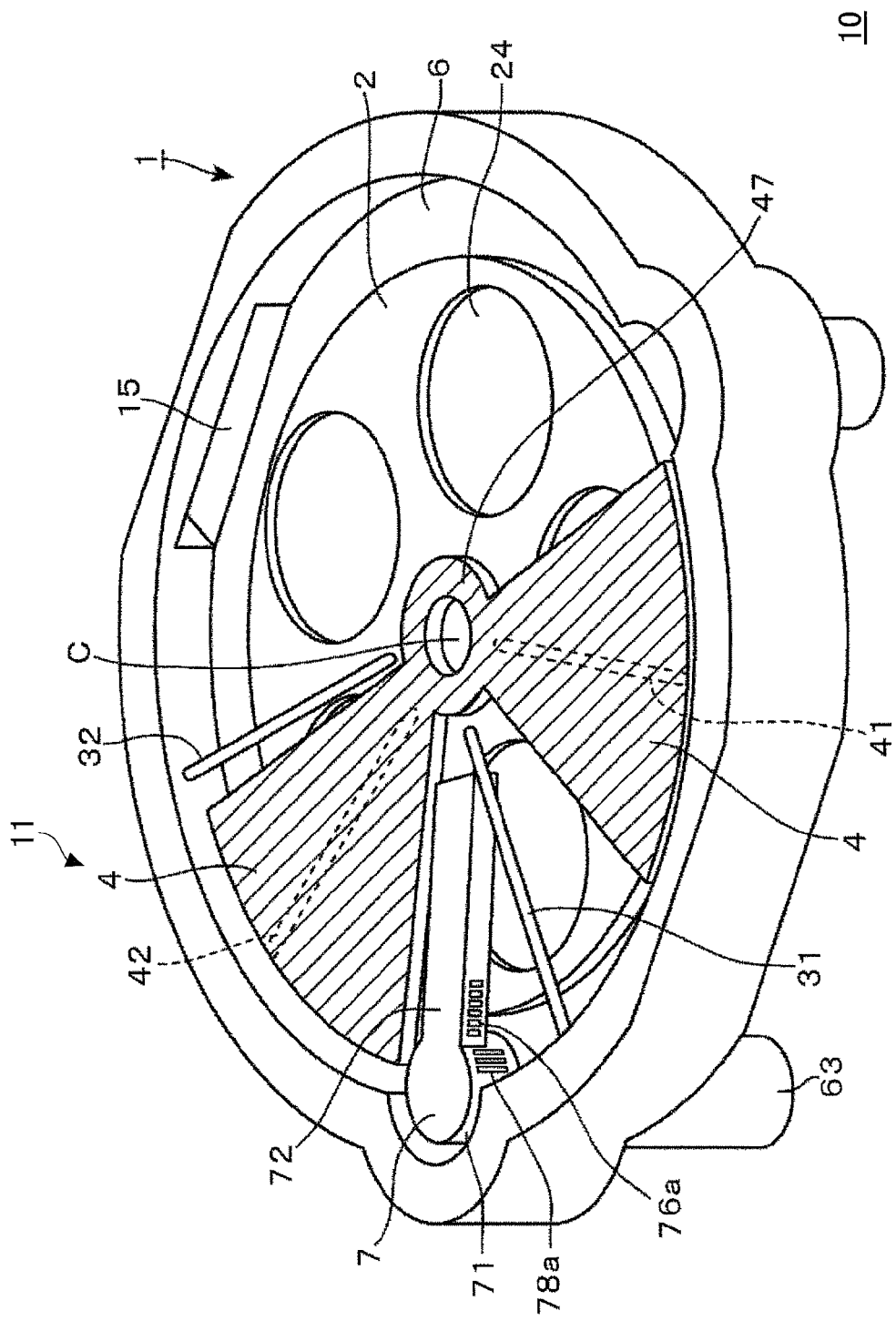
FIG. 2 is a perspective view of the film deposition apparatus of an embodiment.
Figure 3:
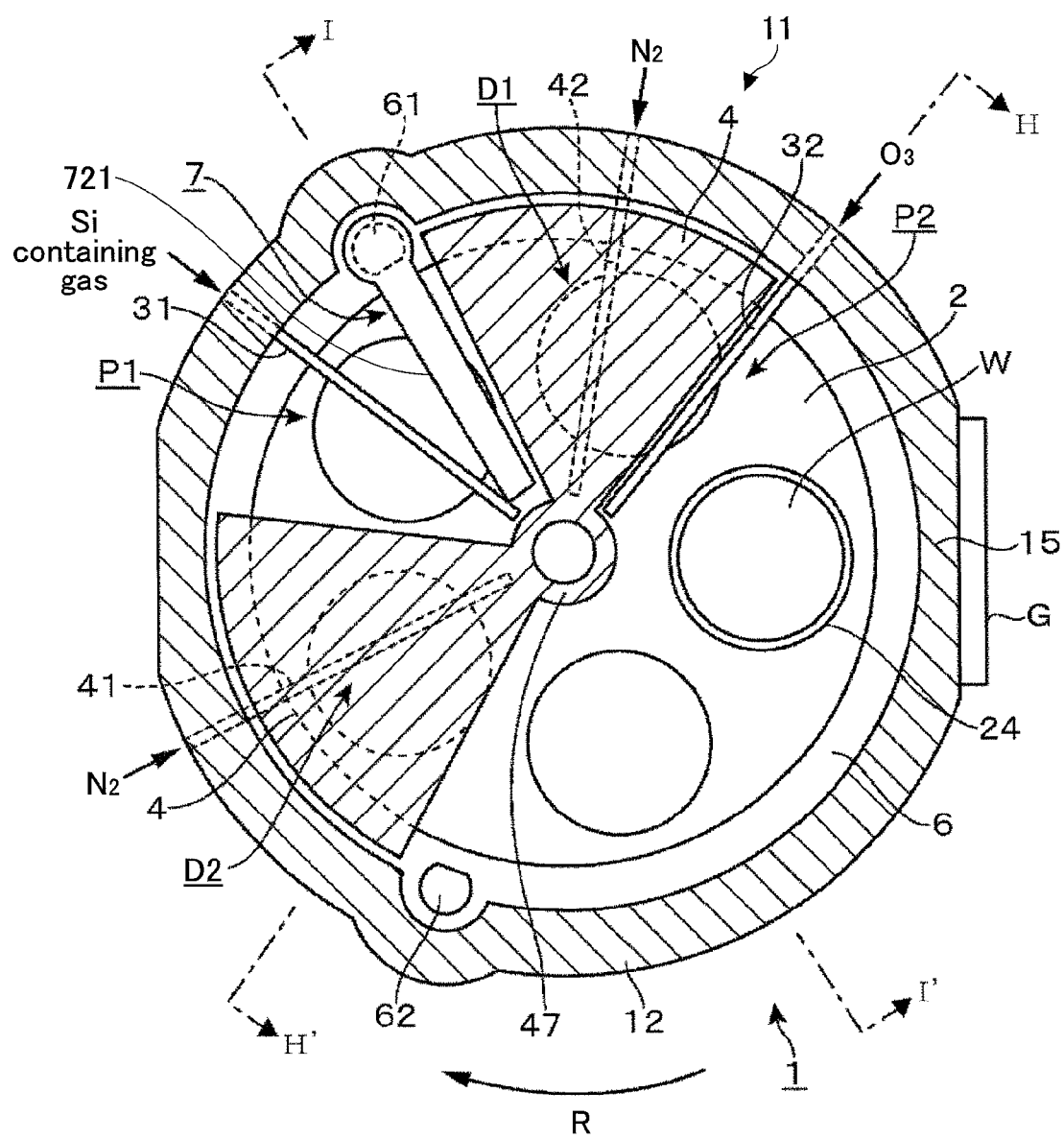
FIG. 3 is a plan view of the film deposition apparatus of an embodiment.
Figure 5:
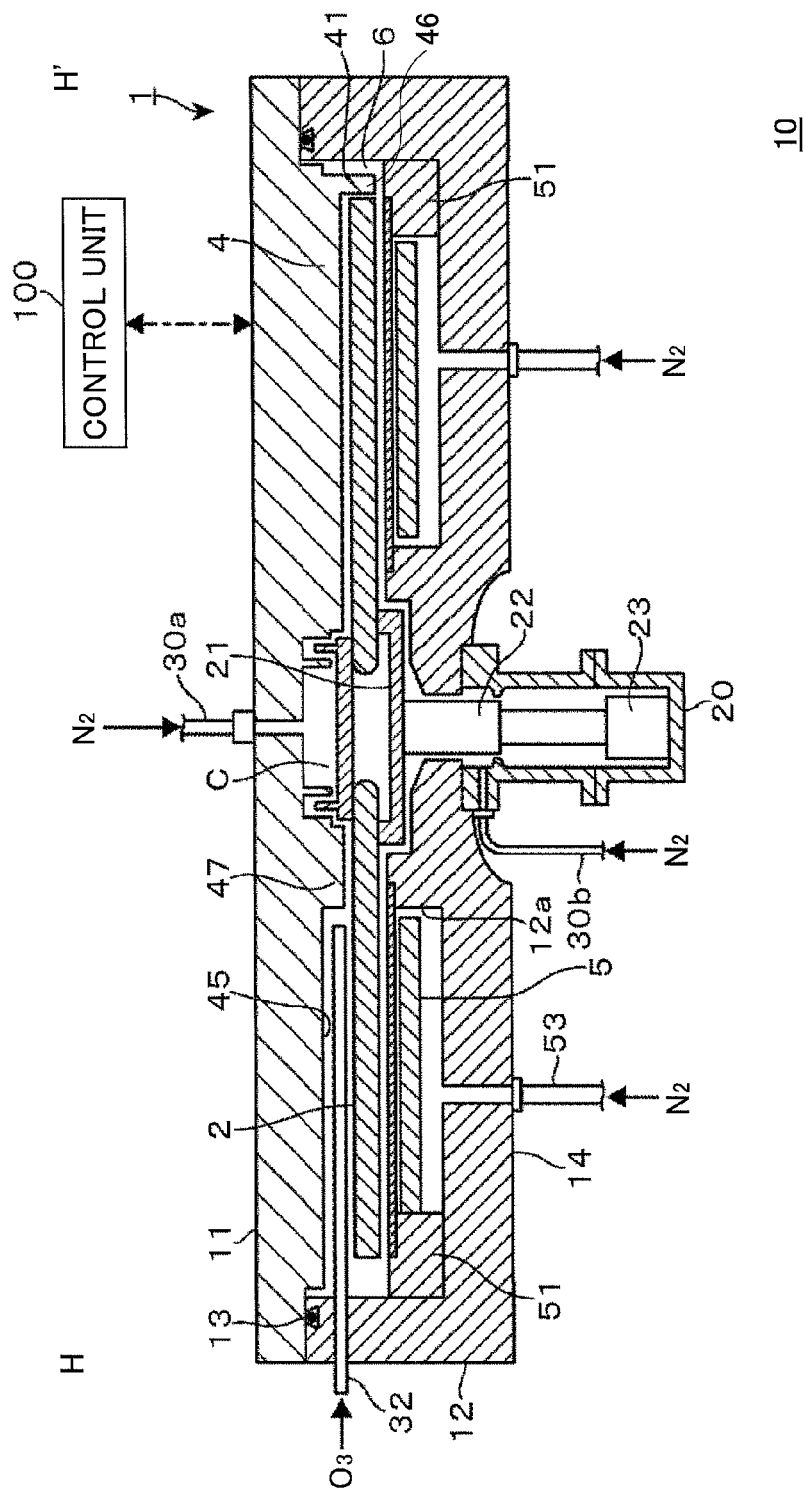
FIG. 5 is a cross-sectional view showing the film deposition apparatus of an embodiment.
Figure 6:
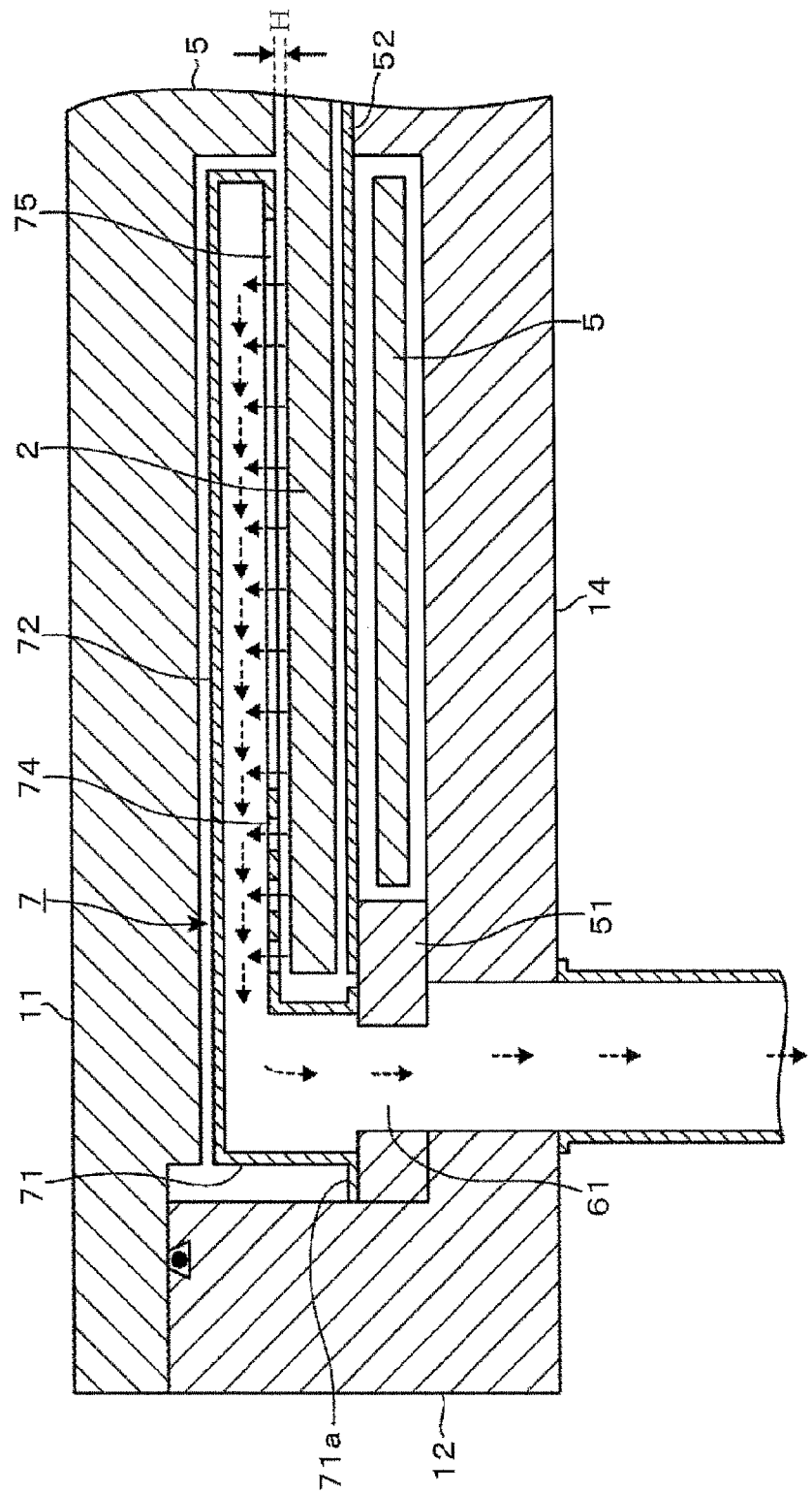
FIG. 6 is a cross-sectional view showing a part of the film deposition apparatus where an evacuation duct is provided.
Figure 7:
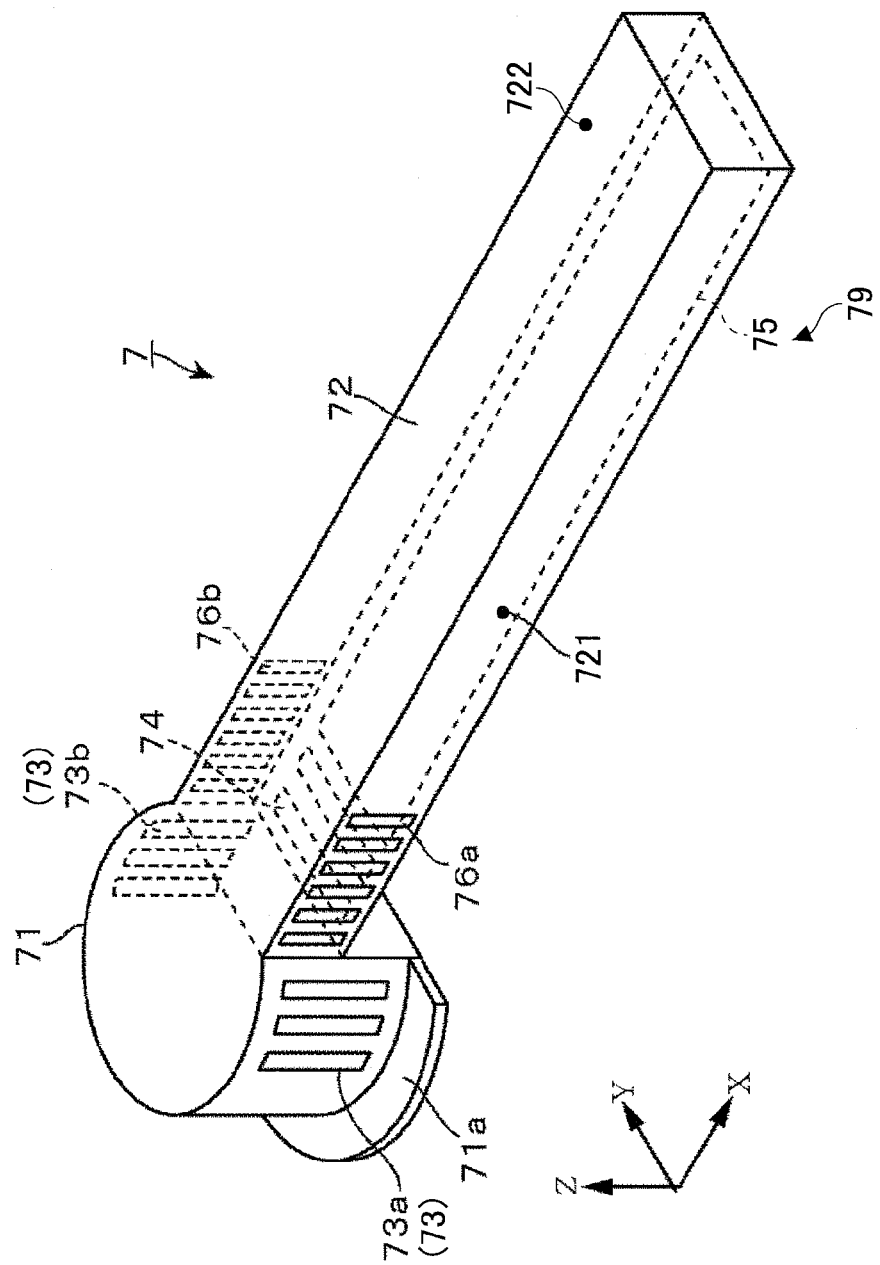
FIG. 7 is a perspective view showing the evacuation duct of the film deposition apparatus.

An example of a structure of a film deposition apparatus 10 of the embodiment is explained with reference to FIG. 1 to FIG. 7. FIG. 1 is a cross-sectional view of the film deposition apparatus 10, FIG. 2 is a perspective view of the film deposition apparatus 10, FIG. 3 is a plan view of the film deposition apparatus 10, FIG. 4A and FIG. 4B are cross-sectional views of the film deposition apparatus 10 and FIG. 5 is a cross-sectional view of the film deposition apparatus 10. FIG. 1 is a cross-sectional view taken along an I-I' line in FIG. 3, and FIG. 5 is a cross-sectional view taken along an H-H' line in FIG. 3. FIG. 6 is a cross-sectional view showing a part of the film deposition apparatus 10 where an evacuation duct 7 is provided. FIG. 7 is a perspective view showing a structure of the evacuation duct 7 of the film deposition apparatus 10.

As shown in FIG. 1, the film deposition apparatus 10 of the embodiment includes a substantially flat circular vacuum chamber 1, a turntable 2, a heater unit 5, a housing member 20, a core portion 21, a rotation shaft 22, a driving unit 23, a separation gas supply pipe 30a, a purge gas supply pipe 30b, a cover member 51, a heater cover member 52, purge gas supply pipes 53, a first gas evacuation port 61 and a second gas evacuation port 62 (see FIG. 3), and a control unit 100. The film deposition apparatus 10 further includes gas evacuating pipes 63, pressure control units 64 and vacuum pumps 65 respectively provided at the first gas evacuation port 61 and the second gas evacuation port 62.

Further, as shown in FIG. 2 and FIG. 3, the film deposition apparatus 10 further includes a separation gas nozzle 41, a first process gas nozzle 31, a separation gas nozzle 42 and a second process gas nozzle 32.

The vacuum chamber 1 includes a container body 12, a ceiling plate 11 detachably attached to the container body 12 and a circular seal member 13 provided at an upper peripheral portion of the container body 12. The seal member 13 may be an O ring.

The separation gas supply pipe 30a is connected to a center portion at an upper side of the ceiling plate 11. The separation gas supply pipe 30a supplies separation gas such as $N_2$ gas in order to suppress mixing of different gasses at a center region C in the vacuum chamber 1.

The turntable 2 is provided in the vacuum chamber 1 and has a rotational center at the center of the vacuum chamber 1 to be rotated along a horizontal plane. The turntable 2 is supported at its center by the core portion 21 having a substantially cylindrical shape. The core portion 21 is rotatable by the rotation shaft 22 that extends in the vertical direction around a vertical axis in a clockwise direction in this embodiment. The driving unit 23 rotates the rotation shaft 22 around the vertical axis. The housing member 20 contains the rotation shaft 22 and the driving unit 23. The housing member 20 is attached to a lower surface of a bottom portion 14 of the vacuum chamber 1 at an upper surface of a flange portion in an airtight manner. The purge gas supply pipe 30b is connected to the housing member 20. The purge gas supply pipe 30b supplies a purge gas such as $N_2$ gas to a lower region of the turntable 2.

The container body 12 of the vacuum chamber 1 is provided with a protruding portion 12a having a ring shape protruding from the upper side of the bottom portion 14 at an outer periphery of the core portion 21 toward the turntable 2.

As shown in FIG. 2 and FIG. 3, the turntable 2 is provided with plural, in this embodiment 5, concave portions 24 each having a circular shape for receiving a wafer W at the surface. The concave portions 24 are formed in a rotational direction R (a circumferential direction). The concave portions 24 are an example of substrate placing areas. Each of the concave portions 24 is formed to have a diameter and a width such that when a wafer W is received in the respective concave portion 24, a surface of the wafer W and a surface of the turntable 2 (where the concave portions 24 are not formed) become substantially the same level. Further, penetrating holes (not shown in the drawings) are formed at a bottom surface of each of the concave portions 24 through which elevation pins (also not shown in the drawings) which support and move the respective wafer W in the vertical direction may penetrate.

As shown in FIG. 2 and FIG. 3, the first process gas nozzle 31, the second process gas nozzle 32, the separation gas nozzle 41, and the separation gas nozzle 42 are radially placed spaced apart to respectively face the concave portions 24 of the turntable 2 along the circumferential direction of the turntable 2 (rotational direction R of the turntable 2). The first process gas nozzle 31, the second process gas nozzle 32, the separation gas nozzle 41, and the separation gas nozzle 42 may be made of quartz, for example. The first process gas nozzle 31, the second process gas nozzle 32, the separation gas nozzle 41, and the separation gas nozzle 42 are provided to extend from an outer periphery wall of the vacuum chamber 1 toward the center region C and in a horizontal direction to face the rotating concave portions 24. In this embodiment, the separation gas nozzle 41, the first process gas nozzle 31, the separation gas nozzle 42, and the second process gas nozzle 32 are provided in this order from a transfer opening 15, which will be explained later, in a clockwise direction (rotational direction R of the turntable 2).

The first process gas nozzle 31, the second process gas nozzle 32, the separation gas nozzle 41 and the separation gas nozzle 42 are respectively connected to gas supply sources (not shown in the drawings) via flow controlling valves.

The first process gas nozzle 31 is connected to a gas supply source that supplies a first process gas such as a gas containing silicon (Si) (simply referred to as "Si containing gas" hereinafter) for example. Si containing gas may be Bis Tertiary-Butylamino Silane (BTBAS, $SiH_2(NH-C(CH_3)_3)_2$) or the like. The second process gas nozzle 32 is connected to a gas supply source that supplies a second process gas such as $O_3$ (ozone) gas for example. The separation gas nozzle 41 and the separation gas nozzle 42 are respectively connected to gas supply sources that supply a separation gas such as $N_2$ (nitrogen) gas for example.

Each of the first process gas nozzle 31, the second process gas nozzle 32, the separation gas nozzle 41 and the separation gas nozzle 42 is provided with plural gas supplying ports 33 (see FIG. 4A and FIG. 4B) at the respective lower surface side along the longitudinal direction at even intervals, for example. Further, the first process gas nozzle 31, the second process gas nozzle 32, the separation gas nozzle 41 and the separation gas nozzle 42 are positioned such that a distance between the respective lower ends and the upper surface of the turntable 2 becomes 1 mm to 5 mm, for example. The evacuation duct 7 is not shown in FIG. 4A and FIG. 4B.

The first process gas nozzle 31 and the second process gas nozzle 32 form a first processing area P1 where Si containing gas is adsorbed onto the wafers W and a second processing area P2 where Si containing gas adsorbed on the wafers W reacts with $O_3$ gas, respectively. The separation gas nozzle 41 and the separation gas nozzle 42 form separation areas D1 and D2 for separating the first processing area P1 and the second processing area P2, respectively. As shown in FIG. 2 and FIG. 3, the ceiling plate 11 of the vacuum chamber 1 is provided with substantially fan-shaped protruding portions 4 at the separation areas D1 and D2.

As shown in FIG. 4A and FIG. 4B, the separation gas nozzle 42 is provided to be fit in groove portions 43 formed in the protruding portions 4. Thus, a lower ceiling surface 44 of the protruding portion 4 is provided at both sides of the separation gas nozzle 42 in the circumferential direction of the turntable 2 in order to prevent mixing of the process gasses. Further, a higher ceiling surface 45 of the ceiling plate 11 which is positioned higher than the lower ceiling surface 44 is provided at both sides of the lower ceiling surface 44 in the circumferential direction, respectively. The ceiling plate 11 may be configured such that a distance between the lower ceiling surface 44 and the upper surface of the turntable 2 (or the upper surface of the wafers W) becomes 1 mm to 4 mm, for example. Although only the separation gas nozzle 42 is shown in FIG. 4A and FIG. 4B, the separation gas nozzle 41 has the same structure as the separation gas nozzle 42.

As shown in FIG. 5 (a cross-sectional view taken along the H-H' line in FIG. 3), a peripheral portion 46 of the protruding portion 4 (at the outer edge side of the vacuum chamber 1) is formed to protrude downward to face the outer edge surface of the turntable 2 while having a reversed L-shape in a cross-sectional view to form a space between the container body 12 in order to prevent mixing of the process gasses.

As shown in FIG. 1, the heater unit 5, which is a heating mechanism, is provided at a space between the turntable 2 and the bottom portion 14 of the vacuum chamber 1. The heater unit 5 is configured to heat the wafers W placed on the turntable 2 via the turntable 2 to be 300° C., for example. The cover member 51 is provided at a side of the heater unit 5. The heater cover member 52 is provided to cover an upper side of the heater unit 5. The purge gas supply pipes 53 are provided at plural positions of the bottom portion 14 of the vacuum chamber 1 below the heater unit 5 in the circumferential direction. A purge gas such as $N_2$ gas for purging a space within the heater unit 5 is supplied to the purge gas supply pipe 53.

A gas evacuating region 6 in a concave shape is formed in a ring shape between the outer periphery of the turntable 2 and the inner wall of the vacuum chamber 1 in the circumferential direction. The first gas evacuation port 61 and the second gas evacuation port 62 are provided in the gas evacuating region 6 to be apart from each other in the circumferential direction. The first gas evacuation port 61 is provided between the first process gas nozzle 31 and the separation area D1 downstream of the first process gas nozzle 31 in the rotational direction R of the turntable 2 to be closer to the separation area D1 side. The second gas evacuation port 62 is provided between the second process gas nozzle 32 and the separation area D2 downstream of the second process gas nozzle 32 in the rotational direction R of the turntable 2 to be closer to the separation area D2. The first gas evacuation port 61 is provided for evacuating the first process gas and the separation gas, and the second gas evacuation port 62 is provided for evacuating the second process gas and the separation gas. As shown in FIG. 1, the first gas evacuation port 61 is connected to the vacuum pump 65, which is a vacuum evacuating mechanism, via the gas evacuating pipe 63 to which the pressure control unit 64 such as a butterfly valve or the like is provided. Similarly, the second gas evacuation port 62 is connected to the vacuum pump 65 via the gas evacuating pipe 63 to which the pressure control unit 64 is provided (not shown in the drawings). In this embodiment, the first gas evacuation port 61 and the second gas evacuation port 62 are formed at the cover member 51.

In this embodiment the evacuation duct 7 is attached to the first gas evacuation port 61. The evacuation duct 7 may be detachably attached to the first gas evacuation port 61. The evacuation duct 7 covers the first gas evacuation port 61 and is formed by a hollow member provided to extend from the inner edge to the outer edge of the concave portion 24 when the respective concave portion 24 exists below the evacuation duct 7 between the first process gas nozzle 31 and the separation area D1 downstream of the first process gas nozzle 31 in the rotational direction R of the turntable 2. Further, the evacuation duct 7 is positioned closer to the separation area D1 than to the first process gas nozzle 31.

As shown in FIG. 6 and FIG. 7, the evacuation duct 7 includes a port cover member 71 provided above the first gas evacuation port 61 and an elongating member 72 connected to the port cover member 71 to extend toward the center region C in the vacuum chamber 1 at an upper portion of the turntable 2 in a substantially horizontal direction. The port cover member 71 has a substantially cylindrical shape extending in an upper and lower direction to surround the periphery of the first gas evacuation port 61. A flange portion 71a which is bent outward is provided at the lower end of the port cover member 71. The port cover member 71 and the elongating member 72 are connected with each other such that inside areas (gas evacuating region) are in communication with each other. The elongating member 72 is formed in a tubular body a cross-sectional view of which is rectangular, for example, and to extend from the inner edge to the outer edge of the concave portion 24 of the turntable 2. The length of the elongating member 72 in the longitudinal direction is set greater than the diameter of the wafer W to be placed on the concave portion 24. Further, a distance H (see FIG. 6) between the lower surface of the elongating member 72 and the upper surface of the turntable 2 (or the upper surface of the wafers W) is set between 1 mm to 4 mm, for example.

The port cover member 71 and the elongating member 72 may be made of quartz, ceramics, aluminum, stainless steel or the like. The evacuation duct 7 is detachably attached to cover the first gas evacuation port 61 by attaching the flange portion 71a of the port cover member 71 to contact the periphery of the first gas evacuation port 61 provided at the cover member 51. The flange portion 71a of the evacuation duct 7 may be attached to the periphery of the first gas evacuation port 61 by screws or the like. The evacuation duct 7 forms a gas evacuating region that extends from the center to the first gas evacuation port 61 at the outer periphery of the turntable 2.

Figure 36:
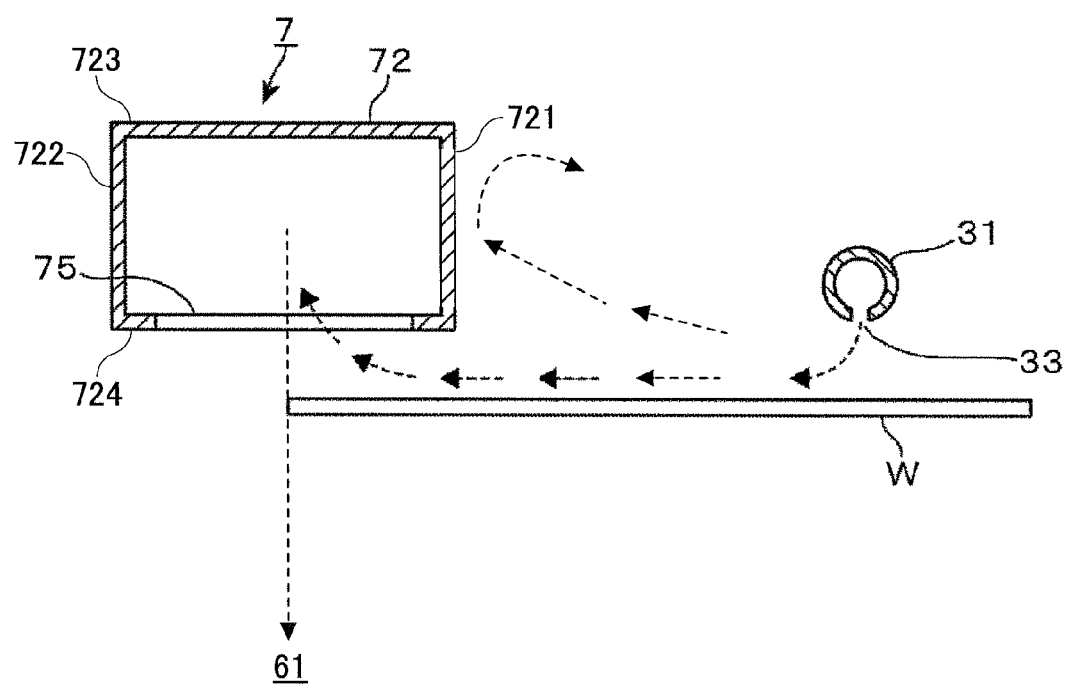
FIG. 36 is a cross-sectional view showing flows of gasses.

FIG. 36 is a schematic view showing a relationship between the evacuation duct 7, the first process gas nozzle 31 and the first gas evacuation port 61.

In this embodiment, the elongating member 72 of the evacuation duct 7 includes a first side wall 721, a second side wall 722, a top portion 723 provided above the first side wall 721 and the second side wall 722 and a bottom portion 724 provided below the first side wall 721 and the second side wall 722. The first side wall 721 is provided between the first process gas nozzle 31 and the first gas evacuation port 61 to extend from the inner edge to the outer edge of the concave portion 24. Further, the first side wall 721 is provided to form a space capable of passing gasses that extends from the inner edge to the outer edge of the concave portion 24 below the first side wall 721 between the first side wall 721 and the wafer W when the wafer W is placed on the concave portion 24 of the turntable 2.

Referring also to FIG. 3, the second side wall 722 is provided downstream of the first process gas nozzle 31 in the rotational direction R of the turntable 2 to face the first side wall 721 and to extend from the inner edge to the outer edge of the concave portion 24.

The top portion 723 and the bottom portion 724 are provided to extend from the inner edge to the outer edge of the concave portion 24 at the upper and lower surfaces of the first side wall 721 and the second side wall 722, respectively. Further, the top portion 723 of the elongating member 72 is provided such that an upper surface becomes substantially the same level as that of a top portion of the port cover member 71. Thus, the evacuation duct 7 has a structure that the top portion 723 of the elongating member 72 and the top portion of the port cover member 71 continuously extend above the first gas evacuation port 61.

Referring also to FIG. 6 and FIG. 7, in this embodiment, the port cover member 71 which is provided outside of the circumference of the turntable 2 is provided with a first gas evacuation opening portion 73. Specifically, in this embodiment, the first gas evacuation opening portion 73 includes plural slits 73a and plural slits 73b, each extending in the upper and lower direction (Z direction in FIG. 7), at sides closer to the elongating member 72 of the port cover member 71, respectively. The slits 73a and the slits 73b are formed along the circumferential direction of the port cover member 71, respectively.

The bottom portion 724 of the elongating member 72 is provided with plural slits 74, each extending in a width direction (Y direction in FIG. 7) of the elongating member 72, at a side closer to the port cover member 71. The plural slits 74 are formed along a longitudinal direction (X direction in FIG. 7) of the elongating member 72. The bottom portion 724 of the elongating member 72 is further provided with an opening portion 75 at a region closer to a front end side of the elongating member 72. The opening area of the opening portion 75 is larger than that of each of the slits 74.

The first side wall 721 and the second side wall 722 of the elongating member 72 are provided with plural slits 76a and plural slits 76b, each extending in the upper and lower direction (Z direction in FIG. 7), at a side closer to the port cover member 71, respectively. The slits 76a and the slits 76b are formed along the longitudinal direction of the elongating member 72, respectively. The slits 74, the opening portion 75, the slits 76a and the slits 76b compose a second gas evacuation opening portion 79.

In this embodiment, at least the slits 76a are partially formed at the first side wall 721 such that a wall portion that isolates the first process gas nozzle 31 and the first gas evacuation port 61 remains at least at a part of the region from the inner edge to the outer edge of the concave portion 24.

As shown in FIG. 36, the evacuation duct 7 regulates flow of the first process gas supplied from the first process gas nozzle 31 such that some of the first process gas moves below the first side wall 721 of the evacuation duct 7, especially where the slits 76a are not formed, to be directed into the evacuation duct 7 via the opening portion 75 to be evacuated to the gas evacuation port 61.

Referring back to FIG. 1, a protruding portion 47 is provided at the center and lower side of the ceiling plate 11 in the vacuum chamber 1. The protruding portion 47 is formed in a ring shape at an outer periphery of the center region C in the circumferential direction. Further, the lower surface of the protruding portion 47 becomes substantially the same level as that (lower ceiling surface 44, see FIG. 4A and FIG. 4B) of the protruding portions 4. A labyrinth structure 48 is provided at further center side of the turntable 2 of the protruding portion 47 above the core portion 21 in order to prevent mixing of the first process gas and the second process gas at the center region C.

As shown in FIG. 2 and FIG. 3, a transfer opening 15 is provided at the side wall of the vacuum chamber 1 for receiving and passing the wafers W between the turntable 2 and an external transfer arm, not shown in the drawings. The transfer opening 15 is capable of being opened and closed by a gate valve G (see FIG. 3) in an airtight manner. Further, the elevation pins and an elevating mechanism for moving the elevation pins (neither is shown in the drawings) are provided at a back side of the turntable 2 at a position corresponding to the transfer opening 15 for elevating the respective wafer W in order to receive and pass the wafer W between the turntable 2 and the transfer arm.

The control unit 100 may be composed of a computer that controls the entirety of the film deposition apparatus 10. The control unit 100 may include a memory that stores a program for performing a process of forming a film, which will be explained later. The program is formed to control the operation of the film deposition apparatus 10. The program may be installed in the control unit 100 from a computer recording medium such as a hard disk, a compact disk, a magneto-optical disk, a memory card, a flexible disk or the like.

Next, operation of the film deposition apparatus 10 of the embodiment is explained.

First, the gate valve G is opened, and then plural wafers W, for example five wafers W, are placed on the turntable 2 via the transfer opening 15 by the transfer arm (not shown in the drawings) while intermittently rotating the turntable 2. At this time, the wafers W may be already treated with an interconnect forming process using a dry etching process, Chemical Vapor Deposition (CVD) or the like so that an interconnect structure is formed in each of the wafers W.

Subsequently, the gate valve G is closed and the vacuum chamber 1 is evacuated by the vacuum pumps 65. Then, the turntable 2 is rotated in a clockwise direction (as shown by an arrow R in FIG. 3 or the like) at 120 rpm, for example, while being heated by the heater unit 5 to heat the wafers W to be 300° C.

Then, Si containing gas and $O_3$ gas are supplied from the first process gas nozzle 31 and the second process gas nozzle 32 at predetermined flow rates, respectively. At the same time, separation gasses are supplied from the separation gas nozzle 41 and the separation gas nozzle 42 at predetermined flow rates, respectively. Then, the vacuum chamber 1 is adjusted to be a set pressure, 500 Pa for example, by the pressure control units 64.

By the rotation of the turntable 2, the wafers W alternately pass through the first processing area P1 where the first process gas nozzle 31 is provided and the second processing area P2 where the second process gas nozzle 32 is provided. Thus, Si containing gas is adsorbed onto a surface of each of the wafers W, and then $O_3$ gas is adsorbed onto the surface of each of the wafers W to form single or plural atomic layers of silicon oxide. Then, by repeating the processes, a silicon oxide film with a desired thickness may be formed.

Figure 8:
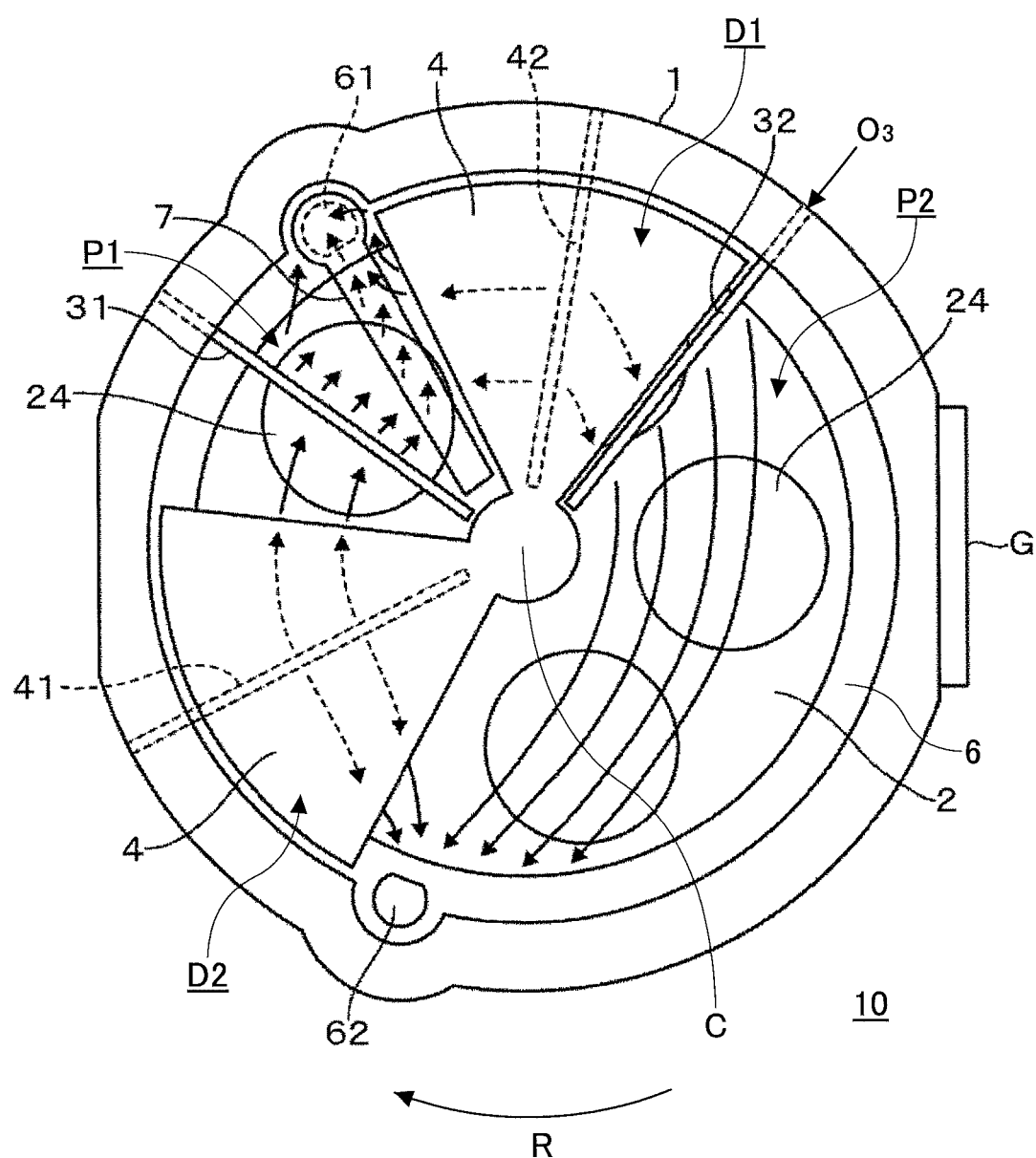
FIG. 8 is a plan view showing flows of process gasses and a separation gas.

FIG. 8 is a plan view showing flow of process gasses and a separation gas.

Although not shown in FIG. 8, $N_2$ gas, which is a separation gas, is supplied from the separation gas supply pipe 30a (see FIG. 1). Thus, $N_2$ gas supplied from the separation gas supply pipe 30a flows from the center region C along the surface of the turntable 2.

Thus, $O_3$ gas, which is supplied from the second process gas nozzle 32 downward and flows toward downstream in the rotational direction R along the surface of the turntable 2, is directed to the second gas evacuation port 62 by the flow of $N_2$ gas supplied from the center region C and the vacuuming function of the second gas evacuation port 62 as shown in FIG. 8.

At this time, some $O_3$ gas may move toward the separation area D1 or the separation area D2. However, by the function of the protruding portions 4, each of which forms a very narrow space with the turntable 2, $O_3$ gas cannot enter below the lower ceiling surface 44 of the protruding portions 4 (see FIG. 4B). Further, $N_2$ gas flows from the separation area D1 and the separation area D2 to the second processing area P2 so that $O_3$ gas cannot enter below the fan-shaped protruding portions 4. Thus, $O_3$ gas is evacuated from the second gas evacuation port 62 through the gas evacuating region 6 between the circumference of the turntable 2 and an inner side wall of the vacuum chamber 1 with $N_2$ gas supplied from the center region C and $N_2$ gas from the separation area D1 and the separation area D2.

Further, Si containing gas such as BTBAS gas or the like, which is supplied from the first process gas nozzle 31 downward and flows toward downstream and upstream in the rotational direction R along the surface of the turntable 2, may be directed to the fan-shaped protruding portions 4 downstream and upstream in the rotational direction R. However, Si containing gas cannot enter below the lower ceiling surface 44 of the protruding portions 4 (see FIG. 4B) and is pushed back to the first processing area P1 even when trying to enter.

Thus, Si containing gas is evacuated from the first gas evacuation port 61 with $N_2$ gas supplied from the center region C and $N_2$ gas from the separation area D1 and the separation area D2.

In this embodiment, the evacuation duct 7 is provided downstream of the first process gas nozzle 31 in the rotational direction R to be aligned with the first process gas nozzle 31. Thus, flow of the process gas supplied from the first process gas nozzle 31 is regulated by the evacuation duct 7. Most of Si containing gas supplied from the first process gas nozzle 31 is directed toward the elongating member 72 as shown in FIG. 6. Then, Si containing gas collides the first side wall 721 of the elongating member 72 (see FIG. 7) and enters into inside the elongating member 72 via the slits 74, 76a and 76b or the opening portion 75. Further, a part of Si containing gas enters inside the port cover member 71 via the first gas evacuation opening portion 73 to be evacuated from the gas evacuation port 61.

As described above, the gasses at the first processing area P1 where the first process gas nozzle 31 is provided are vacuumed from outside of the circumference of the turntable 2 via the slits 73a and 73b of the first gas evacuation opening portion 73 provided at the port cover member 71 that covers the gas evacuation port 61. In addition, the gasses at the first processing area P1 are also vacuumed from inside of the circumference of the turntable 2 via the slits 74, 76a and 76b and the opening portion 75 provided at the elongating member 72 which extends in the radius direction of the turntable 2.

The elongating member 72 is provided with the slits or the opening portions along its longitudinal direction, and the first process gas nozzle 31 is provided with the gas supplying ports 33 along its longitudinal direction. Thus, Si containing gas supplied from the first process gas nozzle 31 flows in the rotational direction R of the turntable 2 to be taken into the elongating member 72 as shown in FIG. 8. Therefore, according to the present embodiment, Si containing gas from the first process gas nozzle 31 is supplied with a high uniformity in the radius direction onto the wafers W placed on the turntable 2.

Here, at the separation areas D1 and D2, process gasses such as Si containing gas and $O_3$ gas in the atmosphere cannot enter below the lower ceiling surfaces 44. However, gas molecules of Si containing gas and $O_3$ gas, which are adsorbed onto the wafers W pass below the lower ceiling surfaces 44 of the fan-shaped protruding portions 4 of the separation areas D1 and D2 to be a part of the films. Further, as described above, as the separation gas is supplied from the center region C toward the circumference of the turntable 2, Si containing gas or $O_3$ gas does not enter into the second processing area P2 or the first processing area P1 via the center region C, respectively.

Further, at each of the separation areas D1 and D2, a peripheral portion of the fan-shaped protruding portion 4 is bent downward to prevent entering of the process gasses. Thus, Si containing gas in the first processing area P1 and $O_3$ gas in the second processing area P2 cannot enter into the second processing area P2 and the first processing area P1 via outside of the turntable 2, respectively. Therefore, the atmosphere of the first processing area P1 and the atmosphere of the second processing area P2 are completely separated by the two separation areas D1 and D2 so that Si containing gas is evacuated from the gas evacuation port 61 and $O_3$ gas is evacuated from the gas evacuation port 62, respectively.

After the films of the wafers W are formed, the wafers W are conveyed out from the vacuum chamber 1 by an operation opposite to that for introducing the wafers W into the vacuum chamber 1. The wafers W placed in the five concave portions 24 of the turntable 2 are conveyed out from the vacuum chamber 1 in order by intermittently rotating the turntable 2.

An example of process parameters is explained. The rotation speed (the rotation number) of the turntable 2 may be, for example, 1 rpm to 500 rpm, 120 rpm in this embodiment where the diameter of the wafer W is 300 mm. The process pressure may be, for example, 133 Pa to 1333 Pa, 500 Pa in this embodiment. The wafers W may be, for example, heated to be more than or equal to be 200° C., 300° C. in this embodiment.

The flow rates of Si containing gas such as BTBAS gas or the like and $O_3$ gas may be 100 sccm and 10000 sccm, respectively, for example. The flow rate of $N_2$ gas from the separation gas nozzle 41 and the separation gas nozzle 42 may be 20000 sccm, for example. The flow rate of $N_2$ gas from the separation gas supply pipe 30a at the center region C of the vacuum chamber 1 may be 5000 sccm, for example.

Further, the cycle number for supplying the process gasses to each of the wafers W, in other words, the number of times that the wafers W respectively pass through the first processing area P1 and the second processing area P2, may be varied in accordance with a targeted desired thickness of the films, but may be plural times, for example 600 times.

According to the embodiment, a process of forming a film such as ALD (or MLD) can be performed with high throughput by placing plural wafers W in the rotational direction R of the turntable 2, rotating the turntable 2 so that the plural wafers W pass below the first processing area P1 and the second processing area P2 in order. Further, the separation areas D1 and D2 are provided between the first processing area P1 and the second processing area P2 in the rotational direction R and the separation gas is also supplied from the center region C toward the circumference of the turntable 2 to evacuate the separation gas and the process gasses from the circumference of the turntable 2 via the first gas evacuation port 61 and the second gas evacuation port 62. Therefore, mixing of the process gasses can be prevented. As a result, a good process of forming a film can be performed.

Further, as the evacuation duct 7 is provided to the first gas evacuation port 61, as described above, Si containing gas from the first process gas nozzle 31 can be supplied with a high uniformity in the radius direction. Thus, Si containing gas can be adsorbed onto the wafers W with a high in-plane uniformity. Therefore, as will be explained in the following examples, the process of forming a film with a high in-plane uniformity (across-the wafer uniformity) can be performed.

Further, as described above, the flow of Si containing gas in the rotational direction R of the turntable 2 is formed so that Si containing gas can be supplied to the entire surface of the wafers W. Therefore, adsorbing efficiency of Si containing gas becomes high. Thus, as will be explained in the following examples, the process of forming a film with a high cycle rate (thickness of the film formed by 360° rotation of the turntable 2) can be performed. Thus, even for performing the process of forming a film on a pattern including a concave portion with a high aspect rate, the thin films can be formed with high coverage. Further, as the evacuation duct 7 is detachably attached, the evacuation duct 7 can be attached, removed, or changed in accordance with the process of forming a film so that degree of freedom in selecting the process of forming a film capable of being performed by a single film deposition apparatus becomes large.

The evacuation duct 7 is provided in the vicinity of the separation area D1 at the downstream side of the first processing area P1 in the rotational direction R such that the elongating member 72 extends from the inner edge to the outer edge of the concave portion 24. Thus, $N_2$ gas flowing from the separation area D1 to the first processing area P1 is evacuated rapidly via the evacuation duct 7. With this, amount of $N_2$ gas that flows into the first processing area P1 is reduced to decrease dilution degree of Si containing gas by $N_2$ gas. In this point as well, adsorbing efficiency of Si containing gas becomes high.

Figure 9:
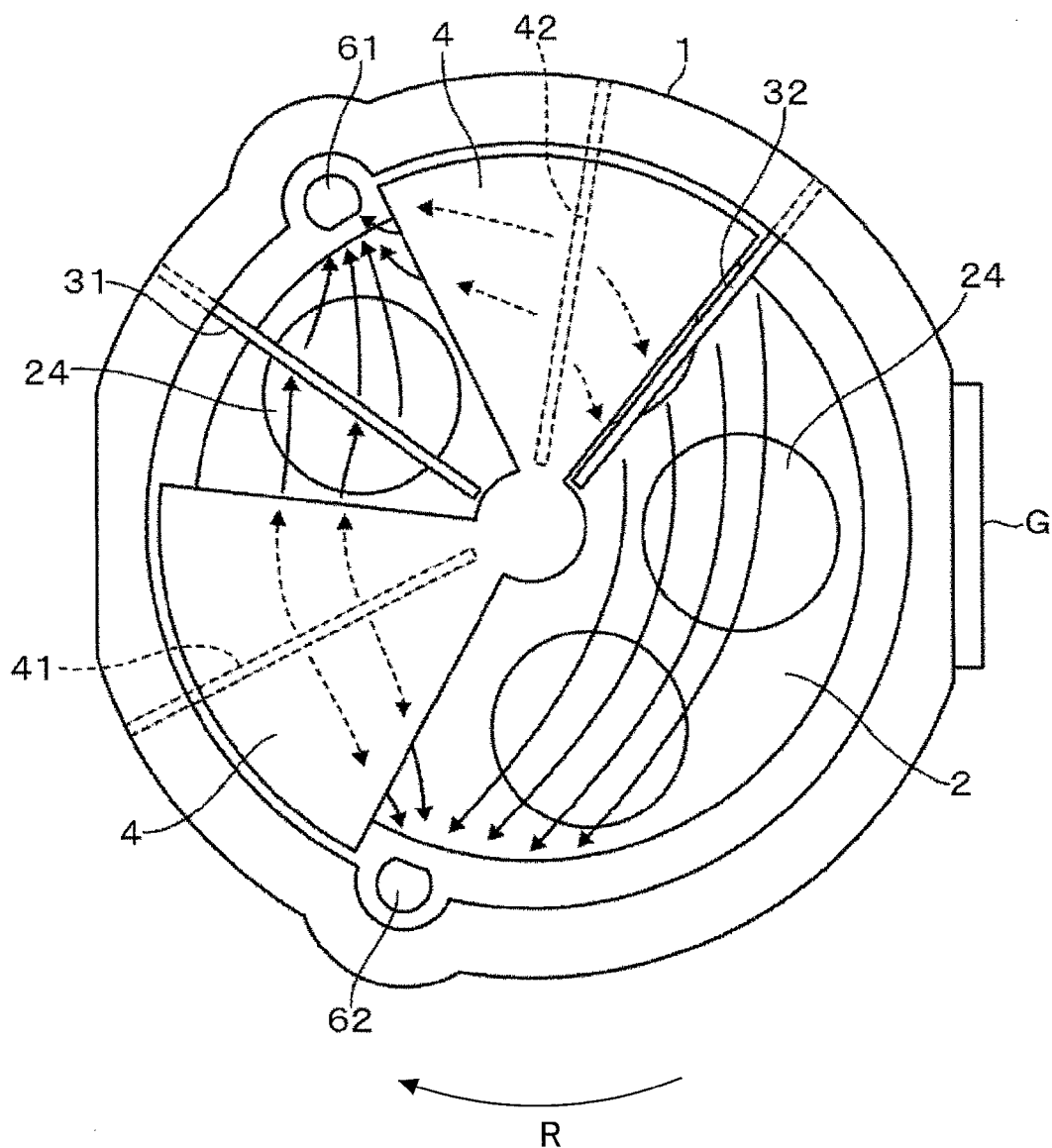
FIG. 9 is a plan view showing flows of process gasses and a separation gas.

On the other hand, in a structure where the evacuation duct 7 is not provided, Si containing gas supplied from the first process gas nozzle 31 to the first processing area P1 moves rapidly toward the first gas evacuation port 61 which is provided at the circumference of the turntable 2, as shown in FIG. 9. Thus, it is difficult to supply Si containing gas with a high uniformity in the radius direction of each of the wafers W. Further, as $N_2$ gas flows into the processing area P1 from downstream in the rotational direction R, Si containing gas is diluted by $N_2$ gas to lower adsorbing efficiency of Si containing gas.

Further, according to the embodiment, the first gas evacuation opening portion 73 is provided to the port cover member 71 of the evacuation duct 7 so that gasses are evacuated from outside of the circumference of the turntable 2 as well. With this structure, by evacuating Si containing gas into the evacuation duct 7 via the first gas evacuation opening portion 73 from the center of the turntable 2, the flow of Si containing gas is regulated. Thus, Si containing gas in the first processing area 21 and the separation gas from the separation area D1 can be surely evacuated in the vicinity of the circumference of the turntable 2. Thus, by combining the evacuation from the first gas evacuation opening portion 73 provided outside of the turntable 2 and the evacuation from the second gas evacuation opening portion 79 provided at the center side of the turntable 2, the gasses are evacuated enough while the flow of Si containing gas in the first processing area 21 is regulated.

Further, by providing the evacuation duct 7, the atmosphere above the wafers W is taken in by the first gas evacuation opening portion 73 and the second gas evacuation opening portion 79 of the evacuation duct 7 when the wafers W on the turntable 2 pass below the evacuation duct 7. At this time, as the evacuation duct 7 is formed to be longer than the diameter of the wafers W and the slits 74 and the opening portion 75 provided at the bottom portion 724 of the evacuation duct 7 position right above the wafers W, the entirety of the atmosphere above the wafers W can be evacuated with certainty by the evacuation duct 7.

Alternative Example 1

Figure 10:
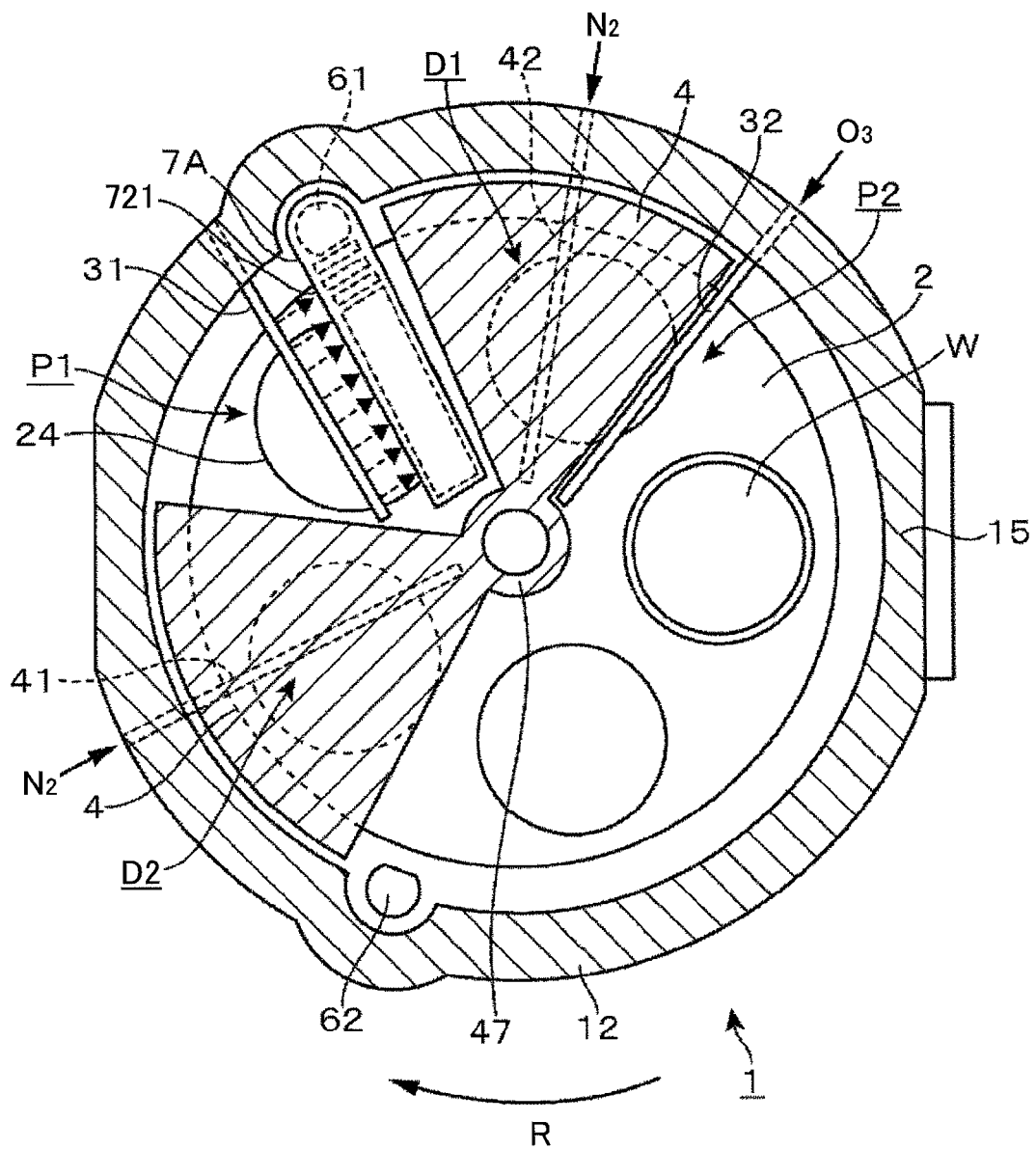
FIG. 10 is a plan view showing another example of the film deposition apparatus of an embodiment.

Alternative example of the structure of the film deposition apparatus 10 of the first embodiment is explained with reference to FIG. 10. FIG. 10 is a plan view showing another example of the film deposition apparatus 10 of the embodiment.

In this example, the film deposition apparatus 10 is different from the above described film deposition apparatus 10 in that the evacuation duct 7 is replaced by an evacuation duct 7A and the first process gas nozzle 31 is placed to be in parallel relationship with the evacuation duct 7A.

The evacuation duct 7A may be placed such that the first side wall 721 of the elongating member 72 facing the first process gas nozzle 31 becomes in parallel relationship with the gas supplying ports 33 (see FIG. 4A and FIG. 4B) of the first process gas nozzle 31, for example. Other structures are the same as those of the film deposition apparatus 10 explained above.

The evacuation duct 7A is provided with the first gas evacuation opening portion 73 and the second gas evacuation opening portion 79 at its side surfaces and a bottom surface, similar to the evacuation duct 7. With this structure, the distance between the gas supplying ports 33 of the first process gas nozzle 31 and the first gas evacuation opening portion 73 and the second gas evacuation opening portion 79 of the evacuation duct 7A becomes substantially the same along the longitudinal direction of the first process gas nozzle 31.

With this structure, when gasses are evacuated from the first gas evacuation port 61 via the evacuation duct 7A, the gasses in the vicinity of the first process gas nozzle 31 are evacuated into the evacuation duct 7A with the evacuating amount being substantially the same in the longitudinal direction of the first process gas nozzle 31. Thus, Si containing gas can be supplied with a high uniformity in the longitudinal direction of the first process gas nozzle 31 so that films with a high in-plane uniformity can be formed on the wafers W on the turntable 2.

Here, for the case shown in FIG. 10, the evacuation duct 7A is placed to extend from the outer edge of the concave portion 24 toward the center of the turntable 2, and the first process gas nozzle 31 is placed to be in parallel relationship with the thus placed evacuation duct 7A. However, alternatively, the first process gas nozzle 31 may be placed to extend from the outer edge of the concave portion 24 toward the center of the turntable 2, and the evacuation duct 7A may be placed to be in parallel relationship with the thus placed first process gas nozzle 31.

Alternative Example 2

Figure 11:
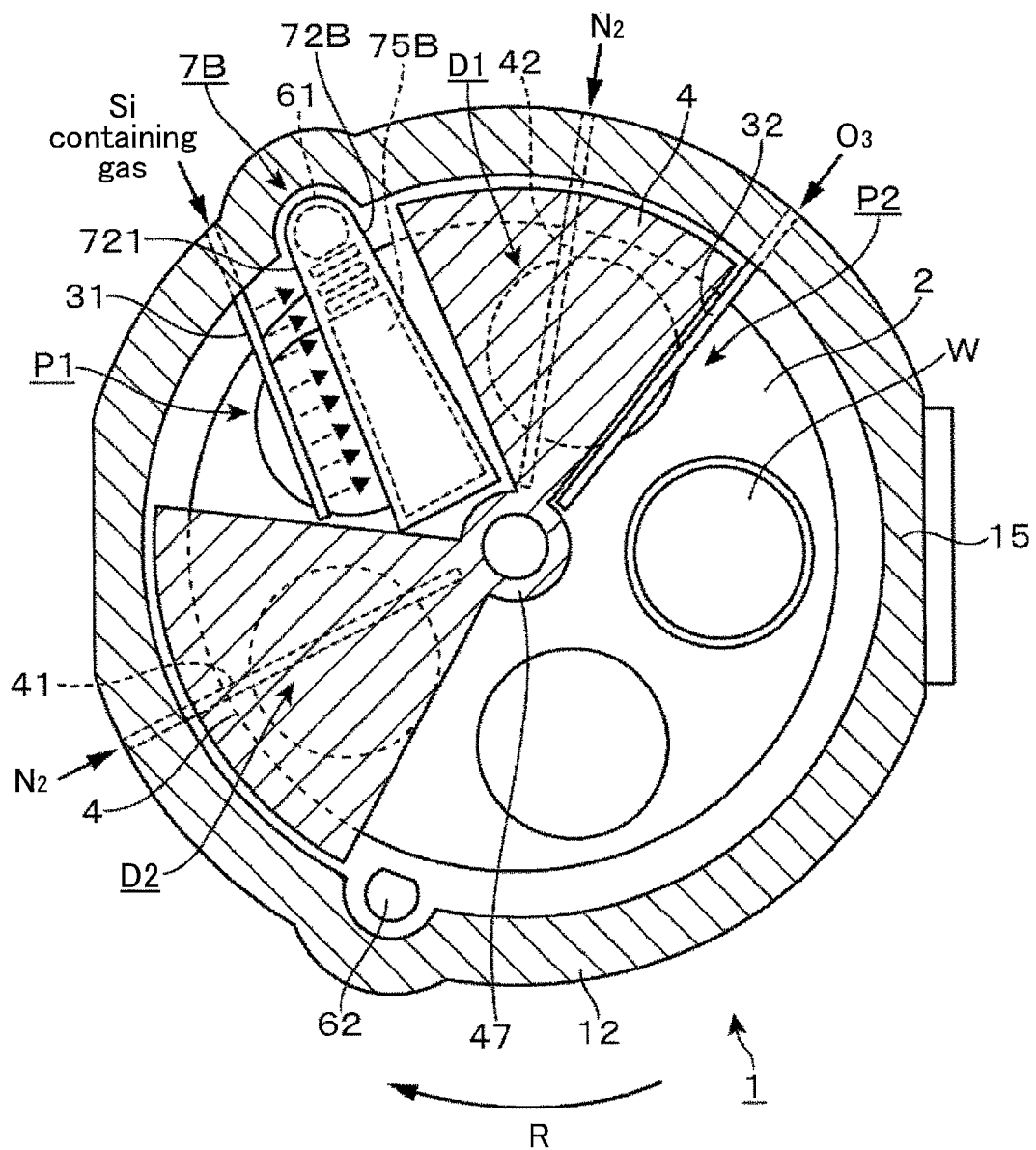
FIG. 11 is a plan view showing yet another example of the film deposition apparatus of an embodiment.

Another alternative example of the structure of the film deposition apparatus 10 of the first embodiment is explained with reference to FIG. 11. FIG. 11 is a plan view showing another example of the film deposition apparatus 10 of the embodiment.

In this example, the film deposition apparatus 10 is different from the above described film deposition apparatus 10 in that the evacuation duct 7 is replaced by an evacuation duct 7B and the first process gas nozzle 31 is placed to be in parallel relationship with the evacuation duct 7B. The evacuation duct 7B is provided with the first gas evacuation opening portion 73 and the second gas evacuation opening portion 79 at its side surfaces and a bottom surface, similar to the evacuation duct 7. Further, the first gas evacuation opening portion 73 and the second gas evacuation opening portion 79 of the evacuation duct 7B are structured such that opening areas become larger closer to a front end (the center of the turntable 2) compared to a base end.

The first process gas nozzle 31 is provided to extend from the inner edge to the outer edge of the concave portion 24. The evacuation duct 7B may be placed such that the first side wall 721 of the elongating member 72 facing the first process gas nozzle 31 becomes in parallel relationship with the gas supplying ports 33 (see FIG. 4A and FIG. 4B) of the first process gas nozzle 31, for example.

In this example, the elongating member 72B has a trapezoidal shape in which the width becomes greater as closer to the front end side (the center side of the turntable 2) in a plan view. The opening portion 75B (gas evacuation opening portion) formed at the bottom portion 724 (not shown in FIG. 11) of the elongating member 72B also has a trapezoidal shape in accordance with the shape of the elongating member 72B such that the width becomes greater closer to the front end side. The other structures are the same as those of the above described first embodiment.

With this structure, similar to the film deposition apparatus 10 shown in FIG. 10, as the first process gas nozzle 31 is placed to be substantially in parallel relationship with the evacuation duct 7B, Si containing gas can be supplied with a high uniformity in the longitudinal direction of the first process gas nozzle 31 so that films with a high in-plane uniformity can be formed on the wafers W on the turntable 2. Further, in the evacuation duct 7B, the evacuating power may become smaller further from the vacuum pump 65 (first gas evacuation port 61) so that the evacuating power may become the smallest at the most front end. However, with the elongating member 72B of the example, the first gas evacuation opening portion 73 and the second gas evacuation opening portion 79 are formed such that the closer to the front end, the larger the opening area becomes. Thus, the amounts of the gasses evacuated by the evacuation duct 7B become substantially the same along the longitudinal direction of the evacuation duct 7B by forming larger opening areas for areas where the evacuating powers are small to easily evacuate the gasses.

Alternative Example 3

Further, the first gas evacuation opening portion 73 and the second gas evacuation opening portion 79 of the evacuation duct 7 (including the evacuation duct 7A and the evacuation duct 7B, the same hereinafter) may be provided at different positions in the longitudinal direction of the evacuation duct 7 in accordance with the kind of the process of forming a film. The evacuating power of the port cover member 71 and the elongating member 72 can be adjusted by changing the position or the opening area of the first gas evacuation opening portion 73 and the second gas evacuation opening portion 79 to regulate the flow of the gasses. Further, for the evacuation duct 7 explained above, the first gas evacuation opening portion 73 is provided outside of the circumference of the turntable 2 and the second gas evacuation opening portion 79 is provided at the center of the turntable 2. Thus, the degree of changes in the evacuating power of the elongating member 72 becomes large when adjusting the opening area of the first gas evacuation opening portion 73 which is closer to the first gas evacuation port 61.

Alternative Example 4

Figure 12:
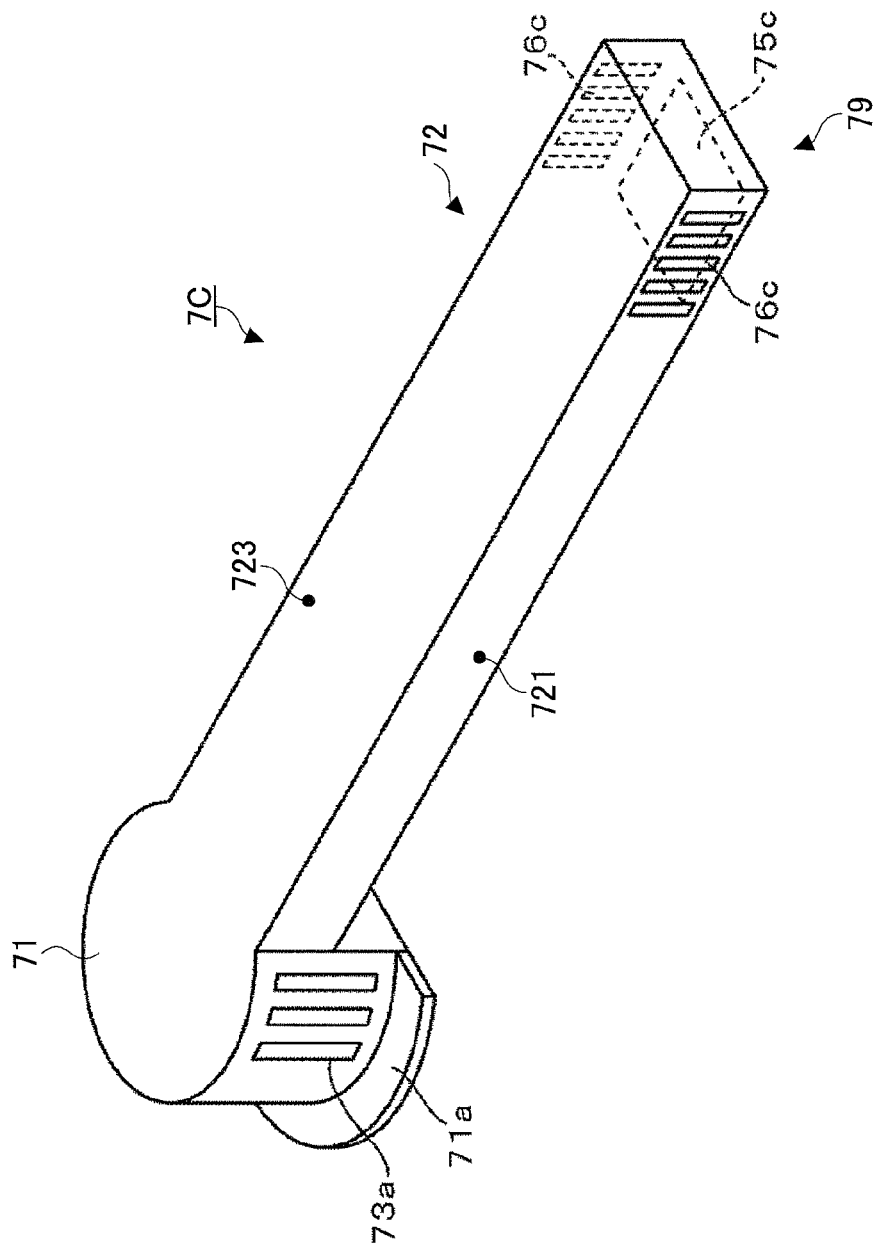
FIG. 12 is a perspective view showing another example of the evacuation duct.
Figure 13:
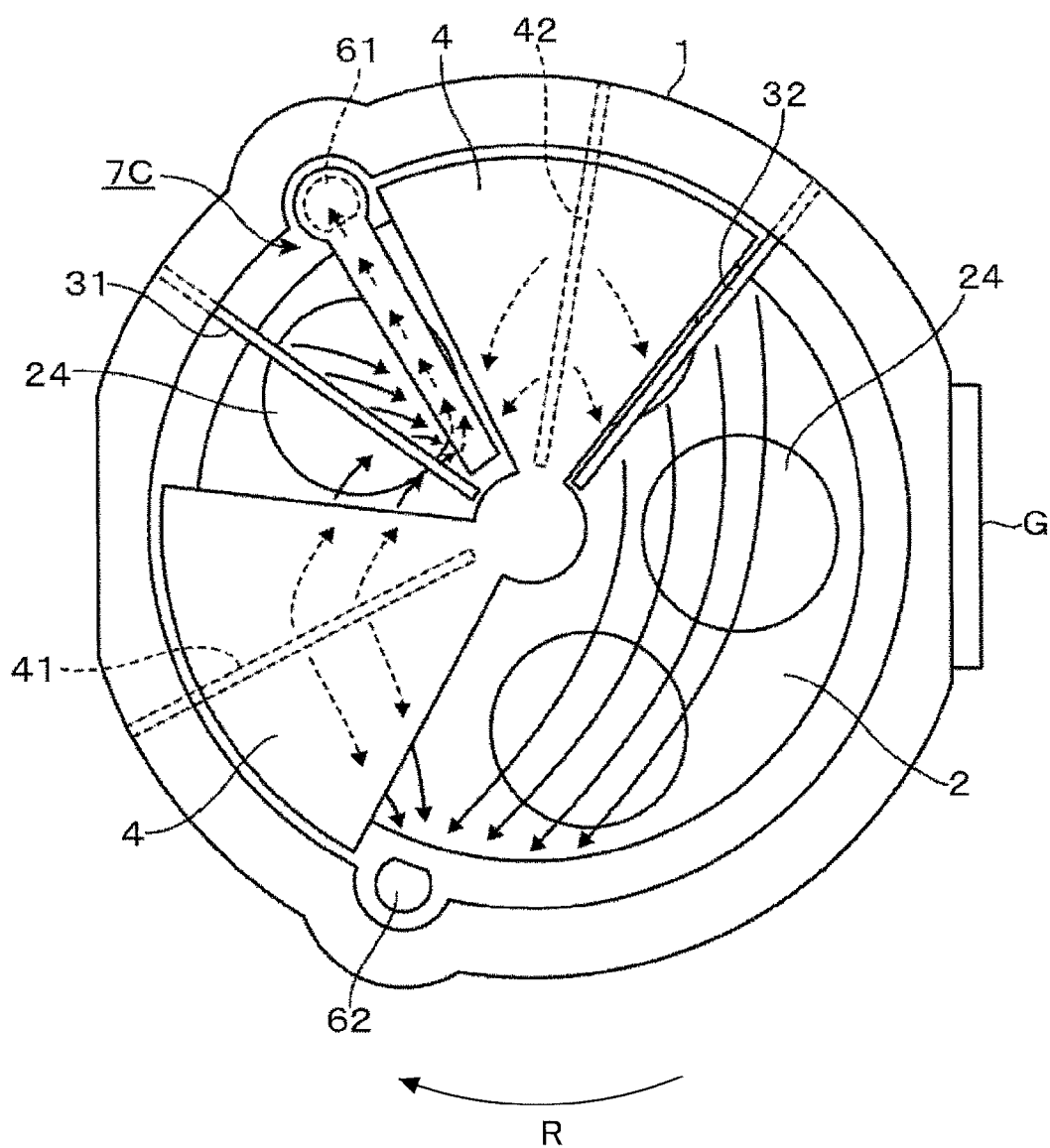
FIG. 13 is a plan view showing flows of process gasses and a separation gas.

FIG. 12 is a perspective view showing an example of a structure of an evacuation duct 7C. FIG. 13 is a plan view showing flow of the first and second process gasses and the separation gas when the evacuation duct 7C is provided in the film deposition apparatus 10.

The evacuation duct 7C shown in FIG. 12 is provided with slits 76c and an opening portion 75c, which are the second gas evacuation opening portion 79, provided at the front end (the inner edge of the concave portion 24) of the evacuation duct 7C. By providing the second gas evacuation opening portion 79 at the front end of the evacuation duct 7C, gasses are taken in from the front end of the evacuation duct 7C as shown in FIG. 13. Thus, Si containing gas supplied from the first process gas nozzle 31 flows toward the front end of the evacuation duct 7C and is evacuated into the evacuation duct 7C from the slits 76c and the opening portion 75c at the front end. Therefore, a flow of gasses toward the center of the turntable 2 is generated in the first processing area P1.

As described above, the flow of the gasses in the processing area P1 changes in accordance with the position or the opening area of the first gas evacuation opening portion 73 and the second gas evacuation opening portion 79 of the evacuation duct 7 (including the evacuation duct 7A, the evacuation duct 7B and the evacuation duct 7C, the same hereinafter). Thus, by previously preparing plural kinds of evacuation ducts in each of which the first gas evacuation opening portion 73 and the second gas evacuation opening portion 79 are provided at an optimal position with an optimal opening area in accordance with a kind of the process of forming a film, and detachably attaching and changing the evacuation duct 7 in accordance with the kind of the purposed process of forming a film, plural kinds of processes of forming a film can be performed with an optimal condition by a single film deposition apparatus. The plural kinds of processes of forming a film include a case where the kinds of films are different, a case where proposed thicknesses of the films are different even when the kind of the film is the same, a case where the rotational speed of the turntable 2, the process pressure, the supplying amount of the process gasses or the like is different, or the like.

Alternative Example 5

Figure 14:
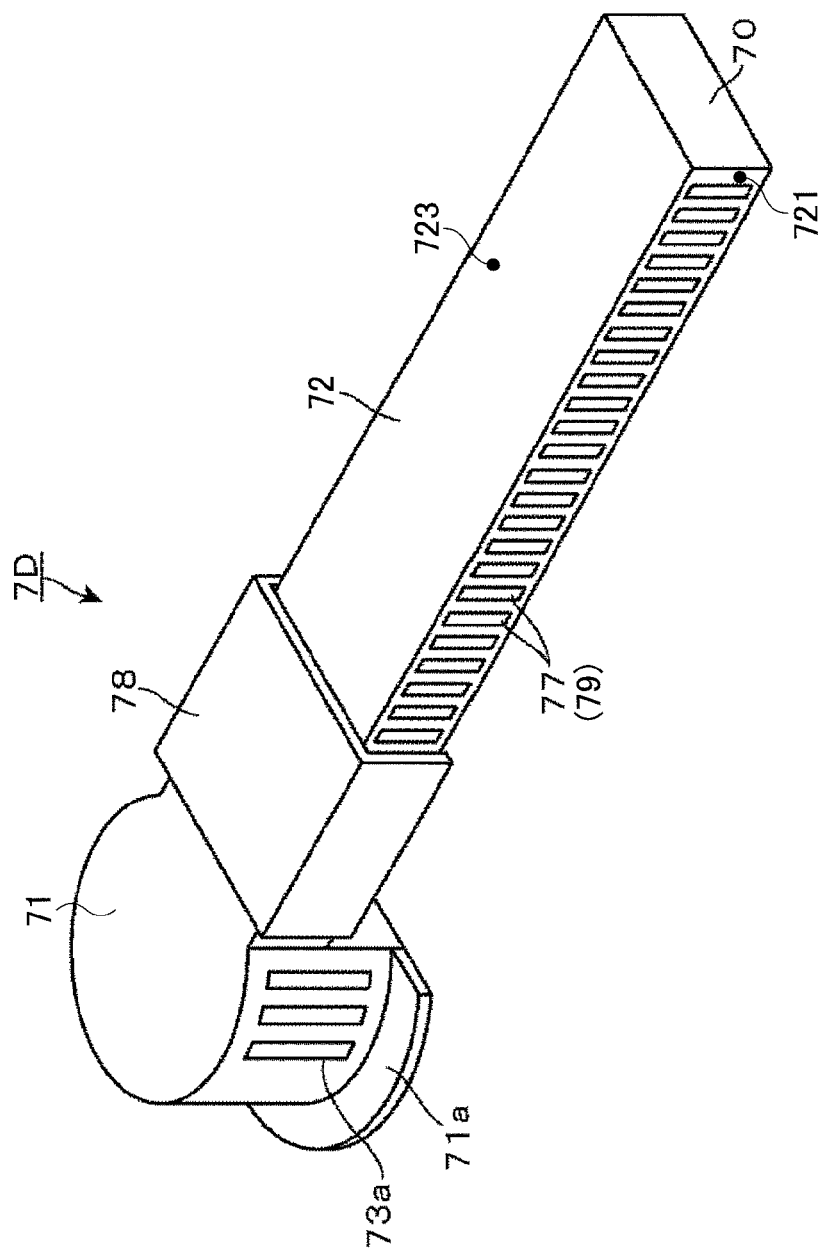
FIG. 14 is a perspective view showing another example of the evacuation duct.

FIG. 14 is a perspective view showing an example of a structure of an evacuation duct 7D. As shown in FIG. 14, the evacuation duct 7D may further include a mask member 78 in addition to the port cover member 71 and the elongating member 72, for example.

Here, the elongating member 72 is provided with plural slits 77 formed on the entirety of the elongating member 72 from the front end to the base end along the longitudinal direction of the elongating member 72. Further, although not shown in the drawings, the elongating member 72 may be provided with an opening portion at the bottom portion 724 (not shown in FIG. 14). The mask member 78 is provided to mask a part of the slits 77 and the opening portion. The mask member 78 may be slidably and detachably attached to the elongating member 72. The mask member 78 is formed to mask a part of the bottom portion 724 (not shown in FIG. 14), the first side wall 721 and the second side wall 722 (not shown in FIG. 14) of the elongating member 72. The mask member 78 may be made of quartz, for example.

With this structure, the mask member 78 may be positioned to control opening and closing of the slits 77 and the opening portion such that the second gas evacuation opening portion 79 is formed at an optimal position in the longitudinal direction of the elongating member 72 of the evacuation duct 7D in accordance with the kind of the process of forming a film.

Further, the elongating member 72 may be provided with a large opening portion that extends in the longitudinal direction of the elongating member 72 instead of the plural slits 77, and the opening area of the second gas evacuation opening portion 79 may be adjusted by partially masking the opening portion.

At this time, opening portions may be provided at the top portion 723, the bottom portion 724, and a front end surface portion 70 of the elongating member 72 and the mask member 78 may be configured to mask a part of or all of the opening portions. Further, the mask member 78 may be configured to mask the plural slits 77 provided at the first side wall 721 and the second side wall 722 such that their lengths in the upper and lower direction become short. Further, the mask member 78 may be configured to mask a part of or all of the first gas evacuation opening portion 73 provided at the port cover member 71.

Alternative Example 6

Figure 15:
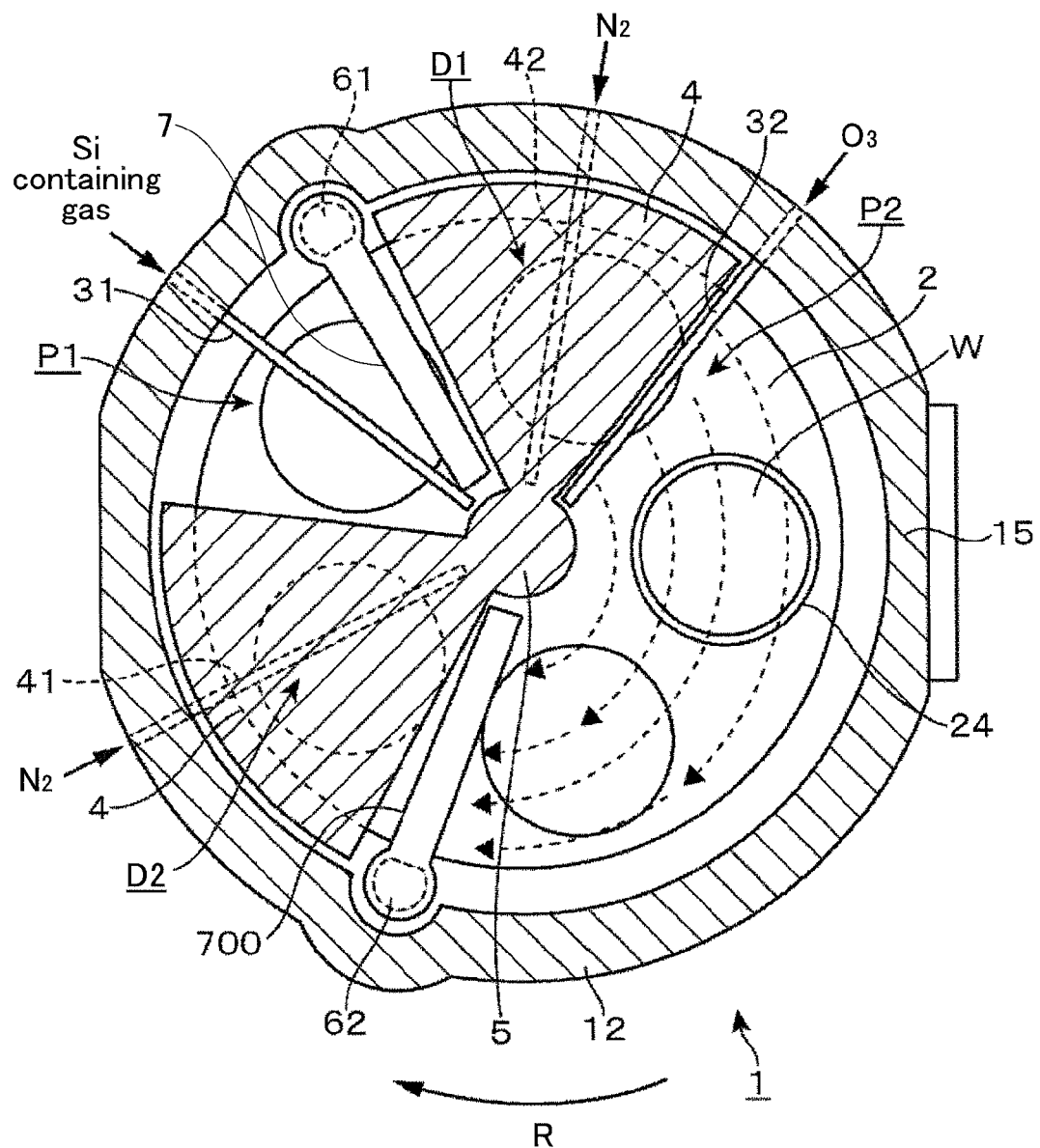
FIG. 15 is plan view showing another example of the film deposition apparatus.

FIG. 15 is a plan view showing another example of the film deposition apparatus 10.

In this example, evacuation ducts are provided for both the first processing area P1 and the second processing area P2. As the in-plane uniformity in the process of forming a film depends on the adsorbing condition of the adsorbing gas, the evacuation ducts may be provided at least for the processing areas where the process gas that generates an adsorbing reaction is supplied.

In this example, the evacuation duct 7 and an evacuation duct 700 are provided at positions corresponding to the first gas evacuation port 61 and the second gas evacuation port 62 of the film deposition apparatus 10, respectively. The evacuation duct 700 is provided between the second processing area P2 and the separation area D2 to be closer to the separation area D2.

With this structure, as schematically shown as dotted lines in FIG. 15, $O_3$ gas from the second process gas nozzle 32 flows in the rotational direction R of the turntable 2. Thus, $O_3$ gas can be uniformly supplied in the second processing area P2 compared with a case when the gasses are directly evacuated toward the second gas evacuation port 62 without providing the evacuation duct 700. Therefore, the contacting time between $O_3$ gas and the wafers W becomes longer to perform enough oxidization. The structure of the evacuation duct 700 is the same as that of the above described evacuation duct 7.

Alternative Example 7

Figure 19:
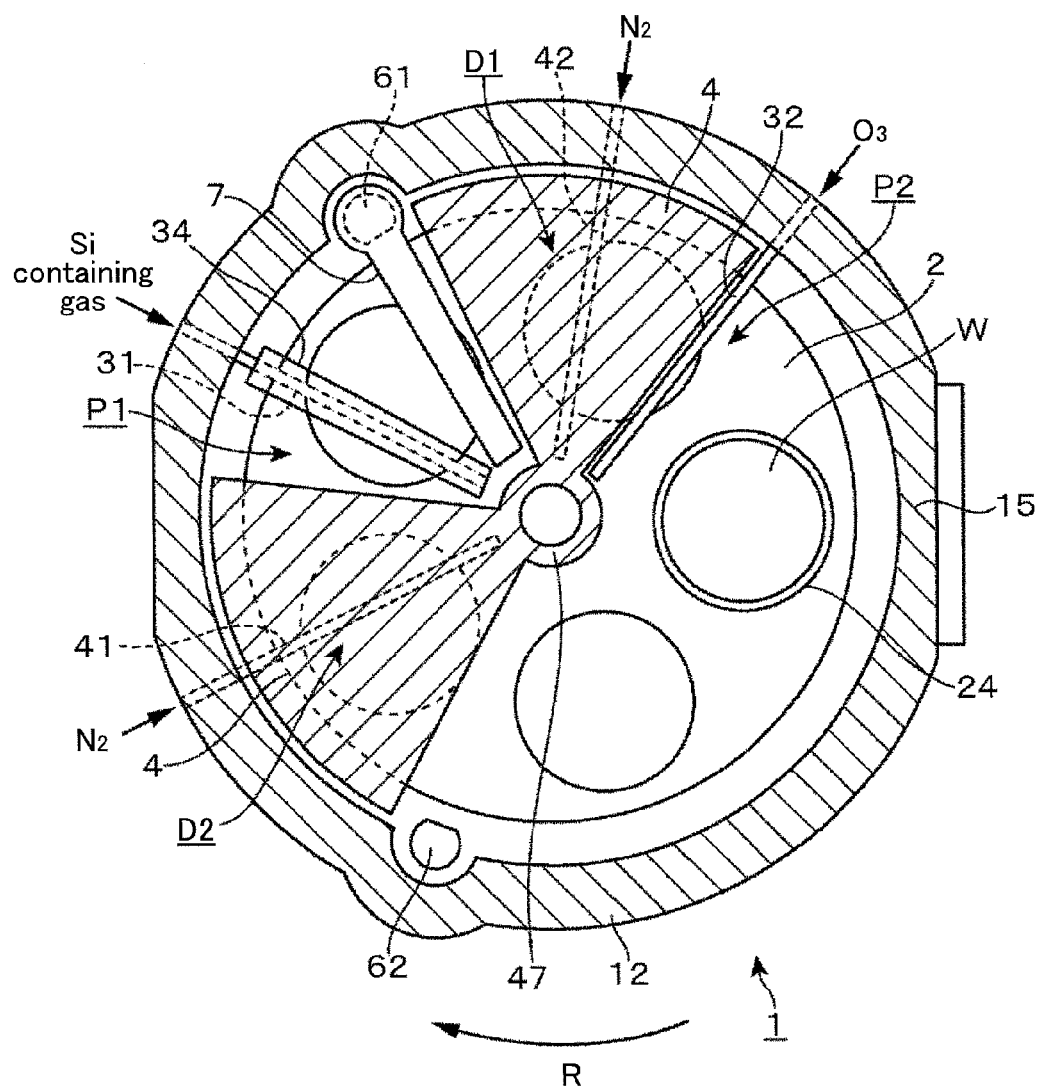
FIG. 19 is a plan view showing another example of the film deposition apparatus.
Figure 20:
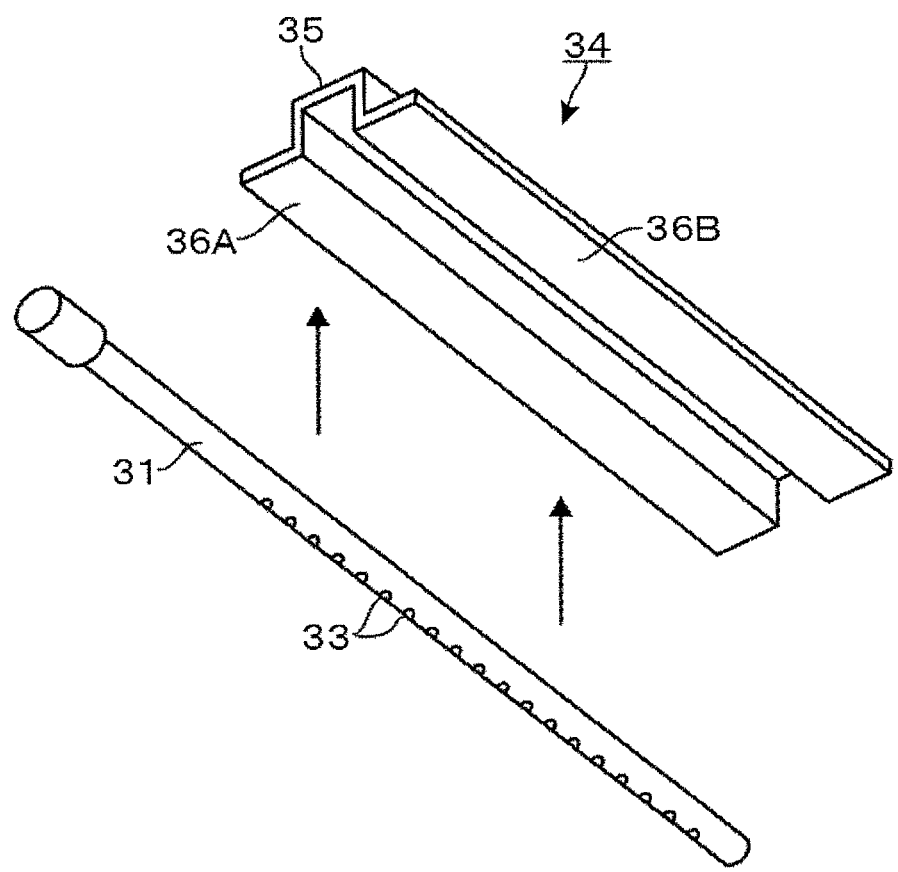
FIG. 20 is a perspective view showing a nozzle cover and a process gas nozzle provided in the film deposition apparatus shown in FIG. 19.
Figure 21:
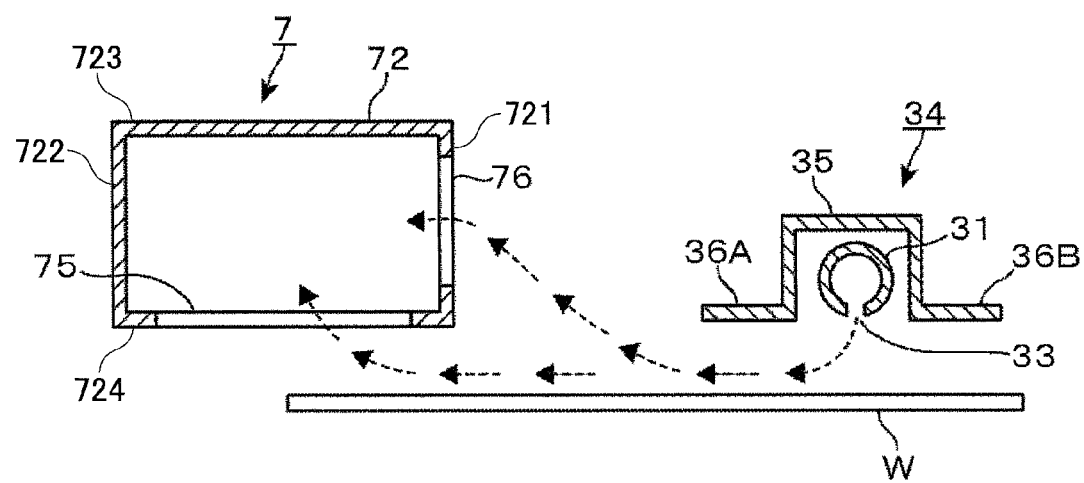
FIG. 21 is a cross-sectional view showing flows of gasses.

FIG. 19 is a plan view showing another example of the film deposition apparatus 10, FIG. 20 is a perspective view showing a nozzle cover 34 and the first process gas nozzle 31 provided in the film deposition apparatus 10 shown in FIG. 19, and FIG. 21 is a cross-sectional view showing a flow of gasses.

As shown in FIG. 19 to FIG. 21, the film deposition apparatus 10 further includes the nozzle cover 34 provided to correspond to the first process gas nozzle 31. The nozzle cover 34 includes a base portion 35 extending in the longitudinal direction of the first process gas nozzle 31 and having a substantially reversed U shape in the cross-sectional view. The base portion 35 covers the top and sides of the first process gas nozzle 31. Further, the nozzle cover 34 is provided with a distributing plate 36A and a distributing plate 36B which are formed at the bottom ends of the base portion 35 toward left and right in the horizontal direction, respectively. In other words, the distributing plate 36A and the distributing plate 36B are protruding toward upstream and downstream on the rotational direction R of the turntable 2, respectively. The lower surfaces of the distributing plates 36A and 36B may be formed at substantially the same level as the lower edge of the gas supplying ports 33 of the first process gas nozzle 31.

With this structure, as shown in FIG. 21, the flow of Si containing gas supplied from the first process gas nozzle 31 is regulated by the distributing plates 36A and 36B not to move upward from regions below the distributing plates 36A and 36B. Thus, Si containing gas easily flows just above the wafers W to increase contacting time with the wafers W. Therefore, Si containing gas can be surely adsorbed onto the wafers W in the first processing area P1 and the process of forming a film can be performed with a high in-plane uniformity.

In this embodiment, the first gas evacuation opening portion 73 of the evacuation duct 7 may be provided outside of the circumference of the turntable 2 and not limited to the slits 73a and the slits 73b as described above. The second gas evacuation opening portion 79 of the evacuation duct 7 may be provided at least at one of the first side wall 721, the second side wall 722 and the lower surface 724 at least at the inner edge of the concave portion 24. When the second gas evacuation opening portion 79 is provided at least at the inner edge of the concave portion 24, Si containing gas from the first process gas nozzle 31 can flow toward the center of the turntable 2. As a result, Si containing gas can be supplied with a high uniformity in the radius direction of the wafers W.

Second Embodiment

In this embodiment, an example where the regulation member is a plate-shaped member is explained.

Figure 16:
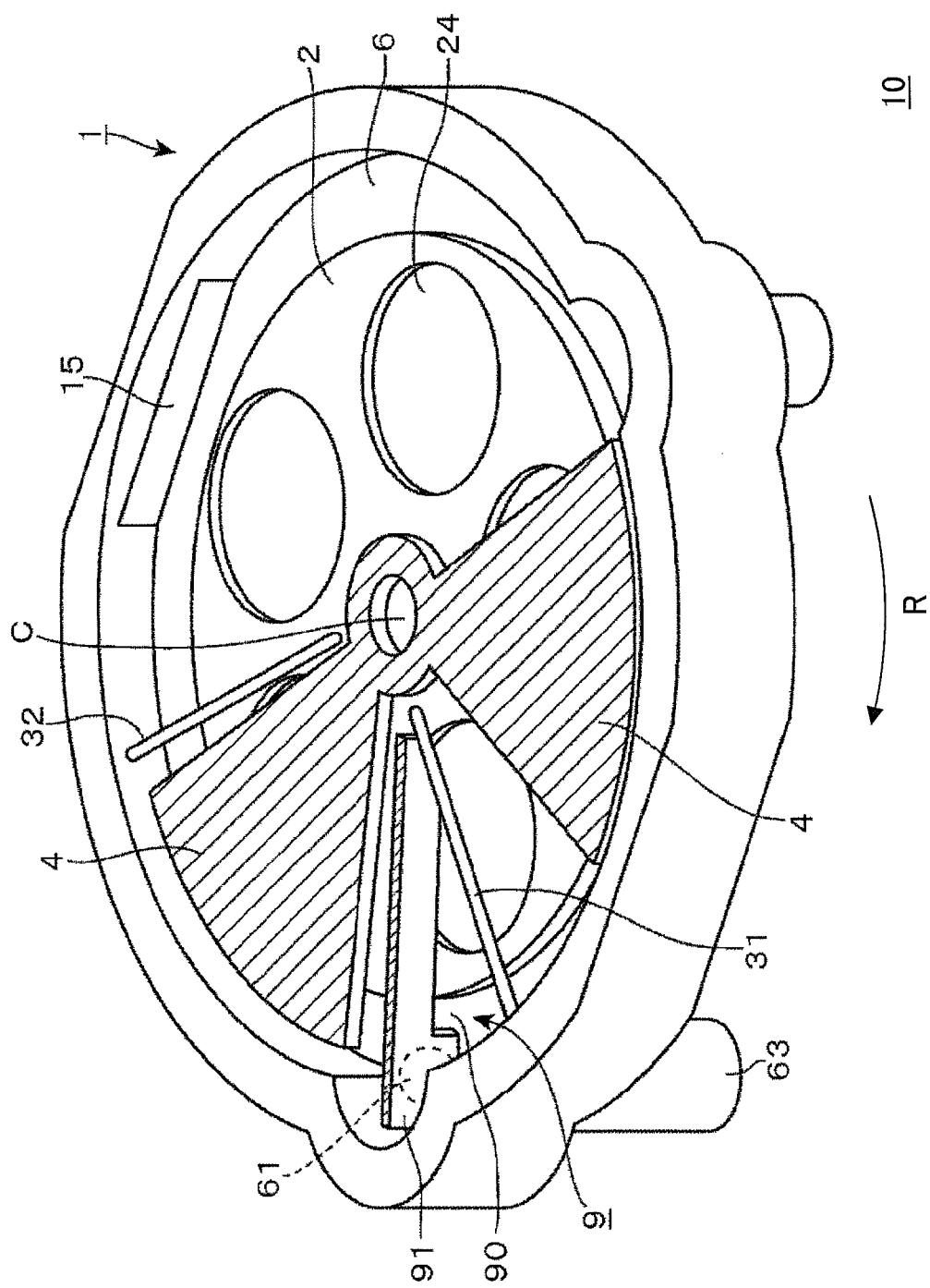
FIG. 16 is a perspective view of a film deposition apparatus of an embodiment.
Figure 17:
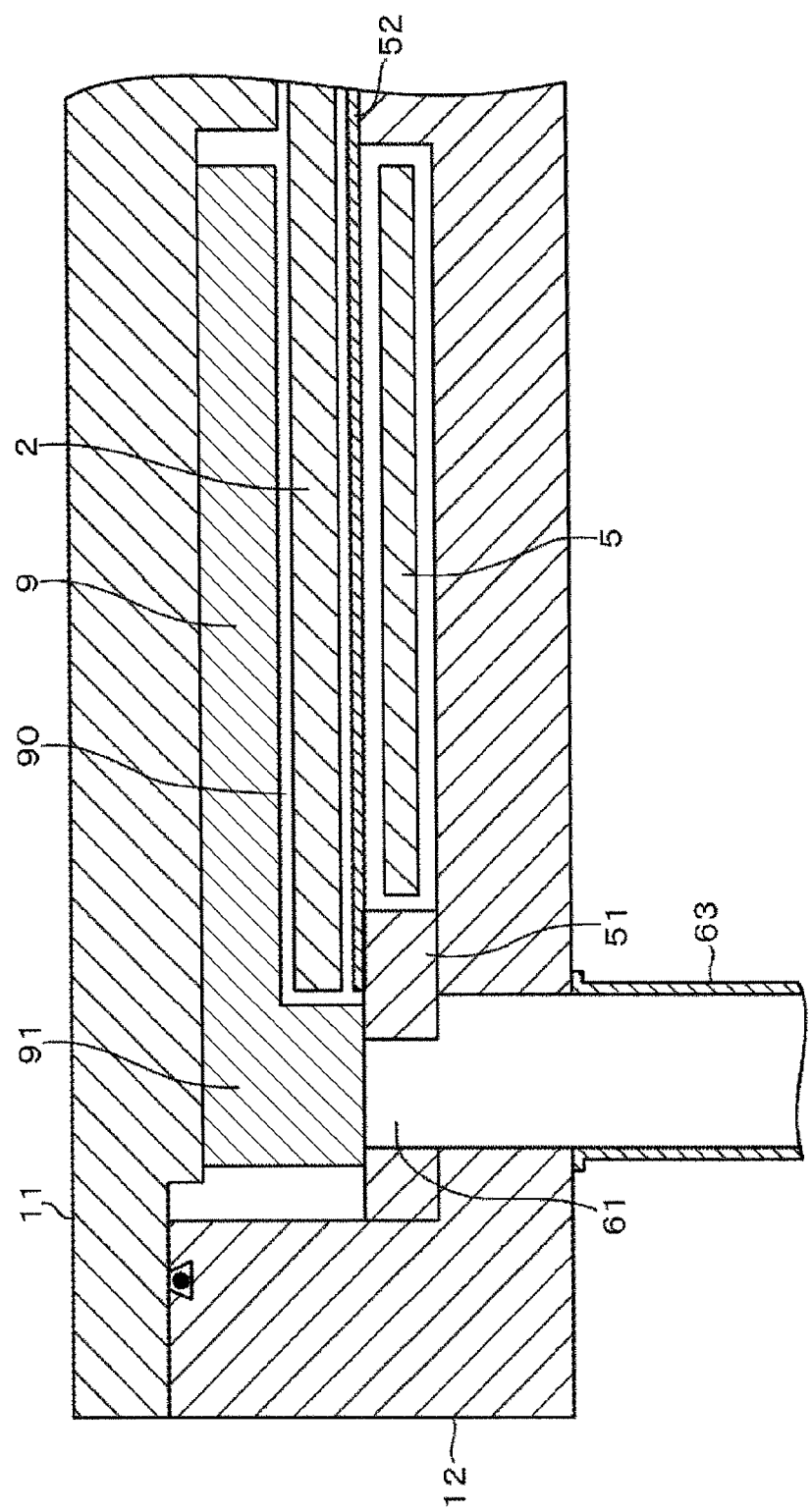
FIG. 17 is a cross-sectional view partially showing the film deposition apparatus shown in FIG. 16.
Figure 18:
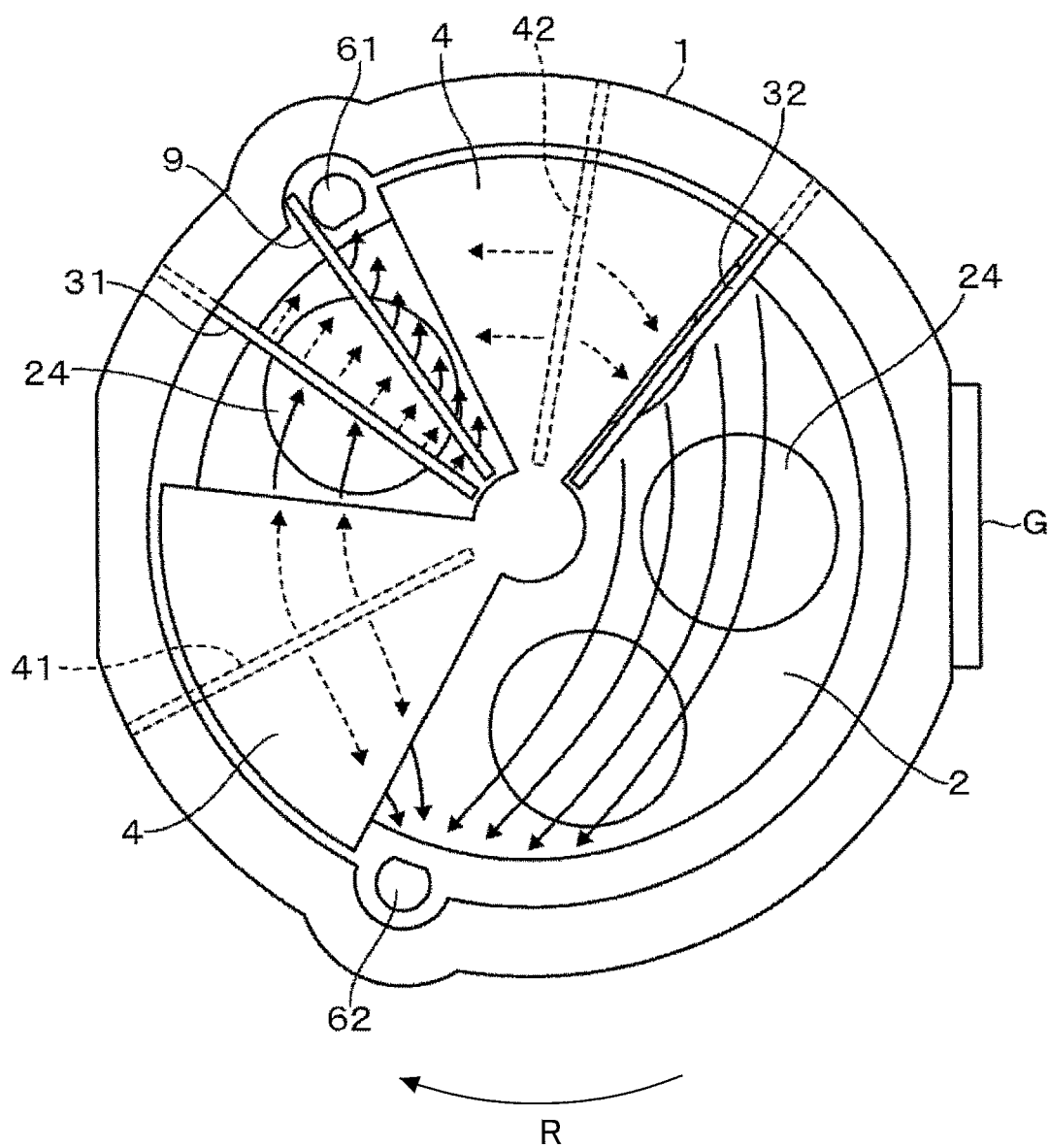
FIG. 18 is a plan view showing flows of process gasses and a separation gas.

An example of the structure of the film deposition apparatus of the embodiment is explained with reference to FIG. 16 to FIG. 18. FIG. 16 is a perspective view of a film deposition apparatus 10. FIG. 17 is a cross-sectional view partially showing the film deposition apparatus 10 where a plate-shaped member 9 is provided.

The plate-shaped member 9 may be provided for at least one of the first processing area P1 and the second processing area P2. In this embodiment, an example where the plate-shaped member 9 is provided for the first process area P1 is explained.

As shown in FIG. 16 and FIG. 17, the plate-shaped member 9 is provided at the first processing area P1 to extend from a side of the gas evacuation port 61 toward the inner edge of the concave portion 24 between the first process gas nozzle 31 and the gas evacuation port 61 while having a space separating it from the turntable 2. The plate-shaped member 9 regulates the flow of the gasses such that the first process gas supplied from the first process gas nozzle 31 moves toward the gas evacuation port 61 by passing below the plate-shaped member 9. A base portion 91 of the plate-shaped member 9 extends downward at the outside of the turntable 2 such that the lower end contacts the cover member 51, for example. Further, the plate-shaped member 9 is provided to extend from the side of the gas evacuation port 61 toward the inner edge of the concave portion 24 so that the upper edge of the plate-shaped member 9 is connected to the lower surface of the ceiling plate 11, for example. The plate-shaped member 9 is provided such that there exists a space 90 between the lower edge of the plate-shaped member 9 and the upper surface of the turntable 2 that extends in the longitudinal direction of the plate-shaped member 9. The shape and the size of the space 90 may be determined such that the flow of the gasses is regulated similarly by the above explained evacuation duct 7.

With this structure, Si containing gas from the first process gas nozzle 31 collides with the plate-shaped member 9 which is positioned downstream of the first process gas nozzle 31 and passes through the space 90 below the plate-shaped member 9 to be evacuated into the gas evacuation port 61 instead of directly directed to the gas evacuation port 61. Thus, as shown in FIG. 18, Si containing gas from the first process gas nozzle 31 flows in the rotational direction R of the turntable 2. Therefore, as Si containing gas can be supplied to the wafers W on the turntable 2 with a high uniformity in the radius direction, the process of forming a film with a high in-plane uniformity can be performed. In this embodiment, although it is described that the upper edge of the plate-shaped member 9 is connected to the lower surface of the ceiling plate 11, there may be a space between the upper edge of the plate-shaped member 9 and the lower surface of the ceiling plate 11.

The plate-shaped member 9 may be provided with opening portions similar to the slits 76a or the like of the first side wall 721 of the evacuation duct 7 explained in the first embodiment.

Further, the plate-shaped member 9 may be provided with plural slits formed along the entirety of the plate-shaped member 9 in the longitudinal direction from the inner edge to the outer edge of the concave portion 24 similar to the evacuation duct 7D shown in FIG. 14 and a mask member may be provided. Further, the plate-shaped member 9 may be provided to be in parallel relationship with the first process gas nozzle 31.

Further, in the above embodiments, not only two kinds of process gasses are used but three or more kinds of process gasses may be used to be supplied onto the wafers W in order. In such a case, gas nozzles may be provided in the vacuum chamber 1 in the circumferential direction such that there are a first process gas nozzle, a separation gas nozzle, a second process gas nozzle, a separation gas nozzle, a third process gas nozzle and a separation gas nozzle in this order, where a regulation member such as the evacuation duct 7 or the plate-shaped member 9 is provided at least for one of the processing areas. Further, the embodiments are applicable to a case where only a single kind of process gas is used.

Further, a combination of the evacuation duct and the plate-shaped member for the processing area, a combination of the evacuation duct and the plate-shaped member for one of the processing areas and the other of the processing areas, respectively may be adoptable.

The Si containing gas as the process gas to be used in the embodiments may be Dichlorosilane (DCS), Hexachlorodisilane (HCD), Trimethylaluminum (TMA), Tris dimethylamino silane (3DMAS), Tetrakis(ethylmethylamino)zirconium (TEMAZ), Tetrakis(ethylmethylamino) hafnium (TEMAH), Strontium bis-Tetramethylheptanedionate (Sr(THD)$_2$), Titanium methylpentanedionate bis-Tetramethylheptanedionate (Ti(MPD)(THD)), Aminosilane or the like.

Example

Examples using the film deposition apparatus 10 are explained.

Example 1

The film deposition apparatus 10 shown in FIG. 1 was used to form films on wafers W under the process condition using the above described process parameters in which the film forming cycle was performed for two minutes for each of plural rotational speeds of the turntable 2. Then, the thickness of the formed film, in-plane uniformity of the film and cycle rate were measured (example 1).

Further, for relative example 1a, a film deposition apparatus similar to the film deposition apparatus 10 shown in FIG. 1 without the evacuation duct 7 is used to form a film on the wafer W under the same process condition as example 1.

Figure 22:
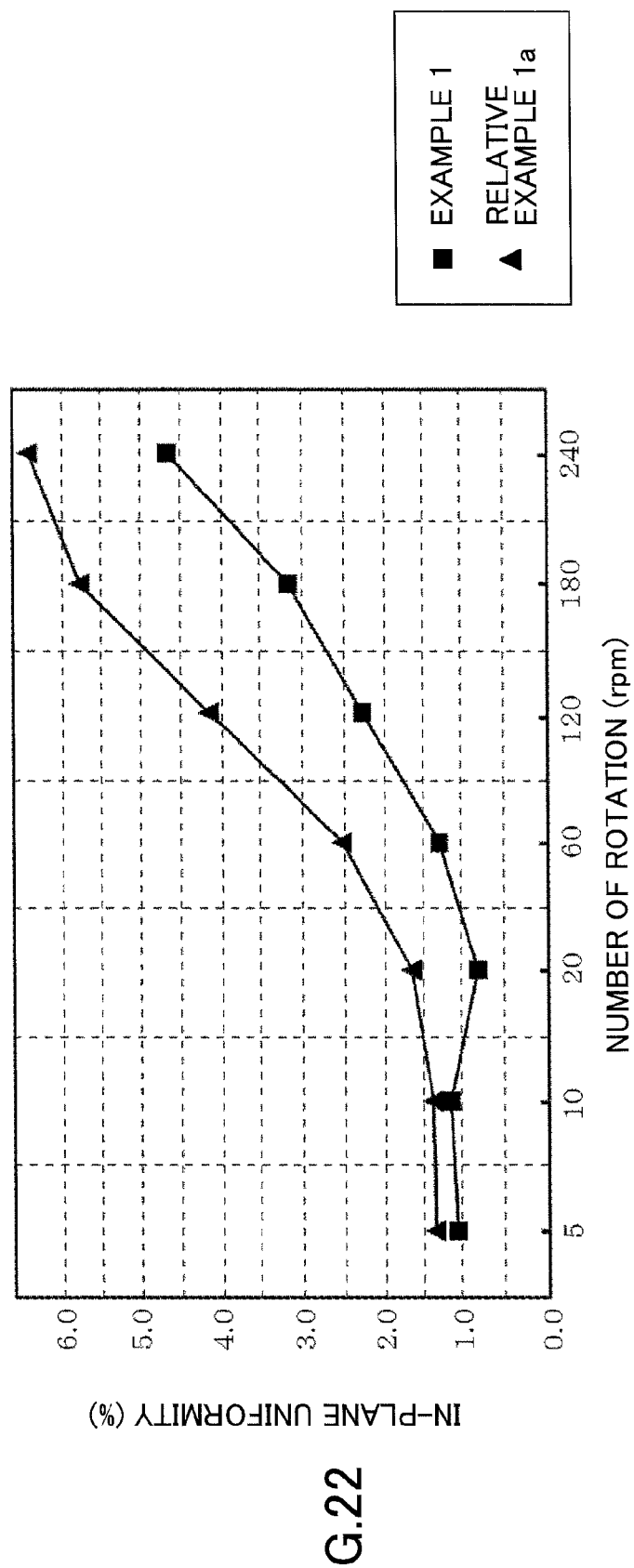
Figure 23:
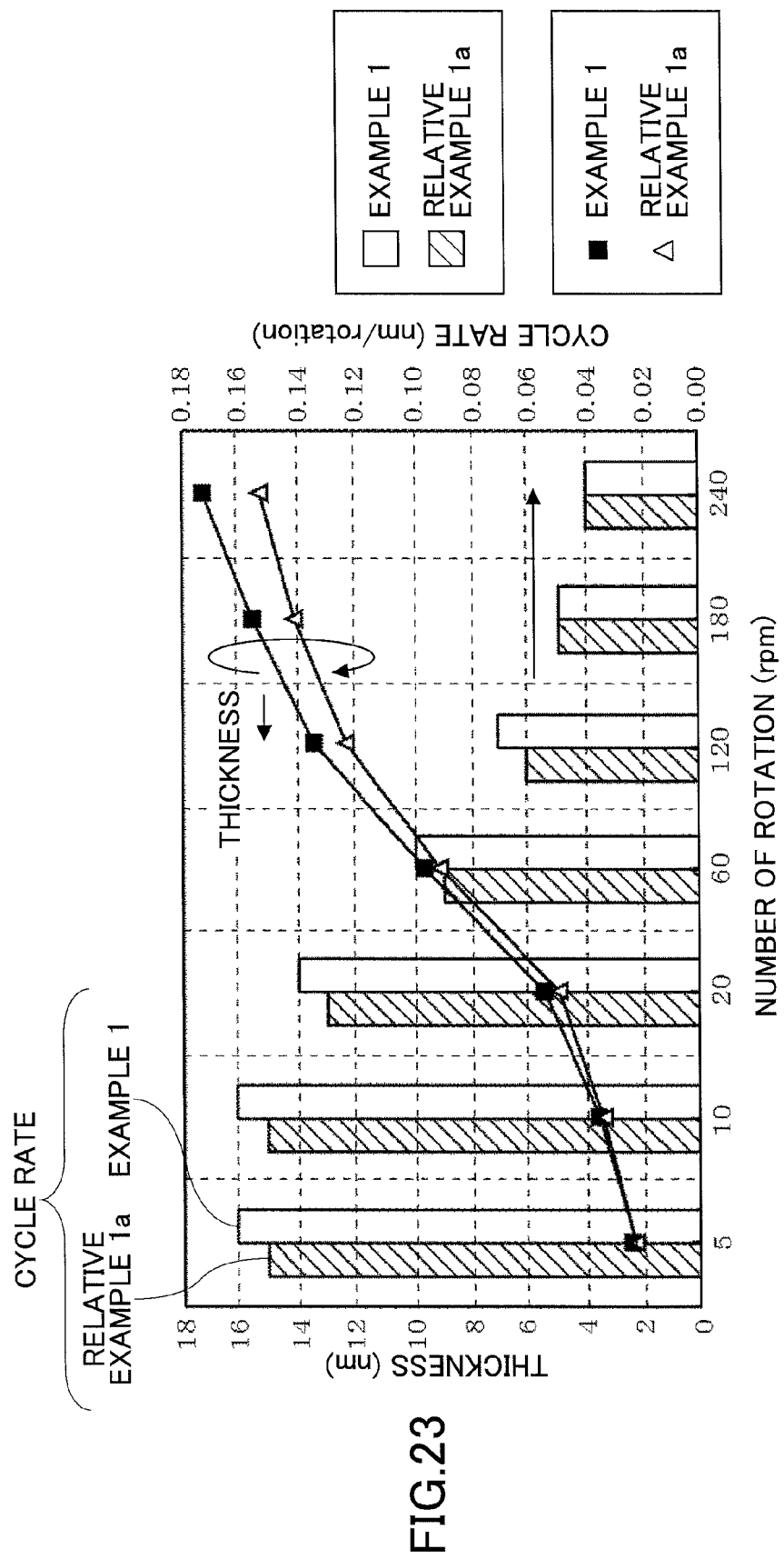

FIG. 22 shows the in-plane uniformity of example 1 and relative example 1a. In FIG. 22, axis of abscissa expresses the rotational speed (the number of rotation) (rpm) of the turntable 2, and axis of ordinate expresses in-plane uniformity (%). FIG. 23 shows the thickness of the film, and the cycle rate of example 1 and relative example 1a. In FIG. 23, axis of abscissa expresses the rotational speed (rpm) of the turntable 2, axis of ordinate at left expresses the thickness (nm) and axis of ordinate at right expresses the cycle rate (nm/rotation). In FIG. 23, the thickness is expressed by line graphs and the cycle rate is expressed by a bar chart. Here, for the bar chart, left bar shows a result for relative example 1a, and right bar shows a result for example 1.

For the result shown in FIG. 22, the smaller the value of the in-plane uniformity becomes, the better the in-plane uniformity of the film is. As a result, for example 1 where the evacuation duct 7 is provided, the value of the in-plane uniformity is smaller than that of relative example 1a. Thus, it was revealed that the in-plane uniformity is better for example 1. Further, as the rotational speed of the turntable 2 becomes higher, the difference in the in-plane uniformity between example 1 and relative example 1a, in other words, the difference between with or without the evacuation duct 7 becomes larger. With this, it can be understood that the process gas is supplied onto the wafers W on the turntable 2 with a high in-plane uniformity by providing the evacuation duct 7. Further, by providing the evacuation duct 7 of the embodiment, a process of forming a film can be appropriately performed even when the rotational speed of the turntable 2 is high, for example more than or equal to 200 rpm, by suppressing lowering of the in-plane uniformity.

Further, from the result shown in FIG. 23, when the rotational speed is less than 180 rpm, it is revealed that the cycle rate becomes higher in example 1. It can be understood that the process gas diffuses in a wide span by providing the evacuation duct 7 so that the adsorbing efficiency of the process gas is improved. Further, by providing the evacuation duct 7, the separation gas does not easily flow into the processing area to prevent dilution of the process gas by the separation gas. Thus, from this point as well, the adsorbing efficiency of the process gas is improved.

(Simulation 1)

A simulation analysis of the processing area P1 of the film deposition apparatus 10 shown in FIG. 1 for pressure distribution, diffusion of the first process gas, flow path of the first process gas is performed.

BTBAS gas is used for the first process gas, and $N_2$ gas is used for the separation gas and the purge gas. Analysis condition is; the temperature of the wafer is 400° C., process pressure is 266 Pa (2 Torr), BTBAS gas flow rate from the first process gas nozzle 31 is 0.9 slm, $N_2$ gas flow rate from the separation gas nozzles 41 and 42 are respectively 0.33 slm and 0.067 slm, $N_2$ gas flow rate from the separation gas supply pipe 30a is 2.5 slm, $N_2$ gas flow rate from the purge gas supply pipe 30b is 0.067 slm and the rotational speed of the turntable 2 is 60 rpm.

Figure 24:
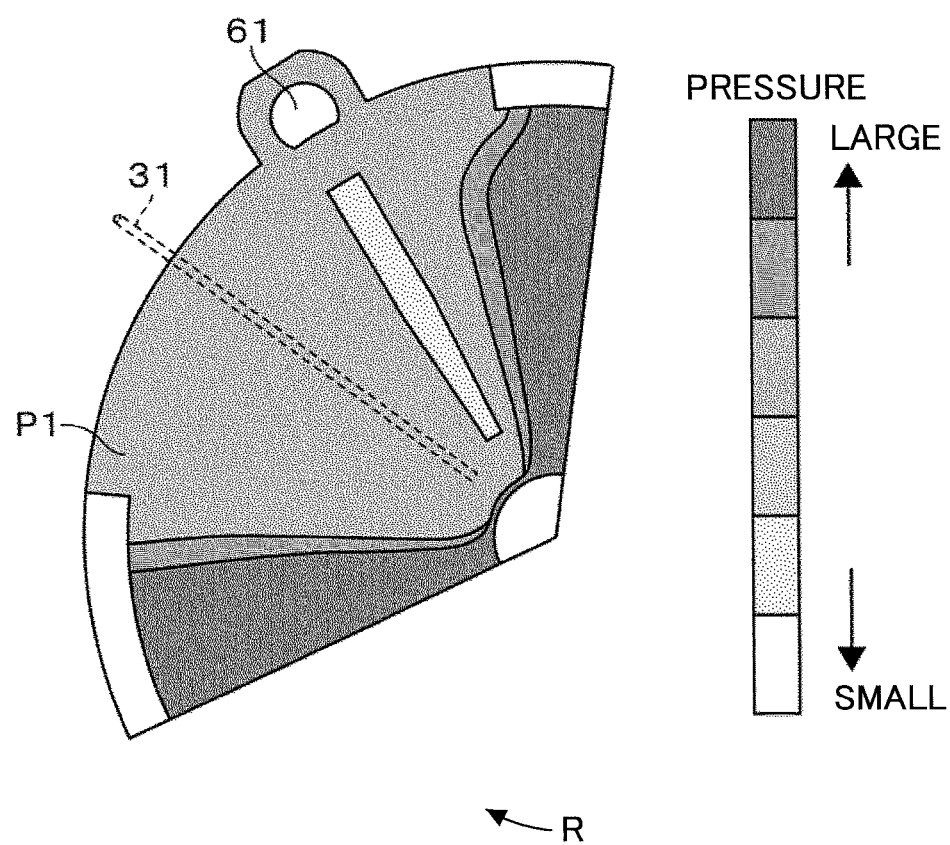
FIG. 24 is plan view showing pressure distribution of example 1b.
Figure 25:
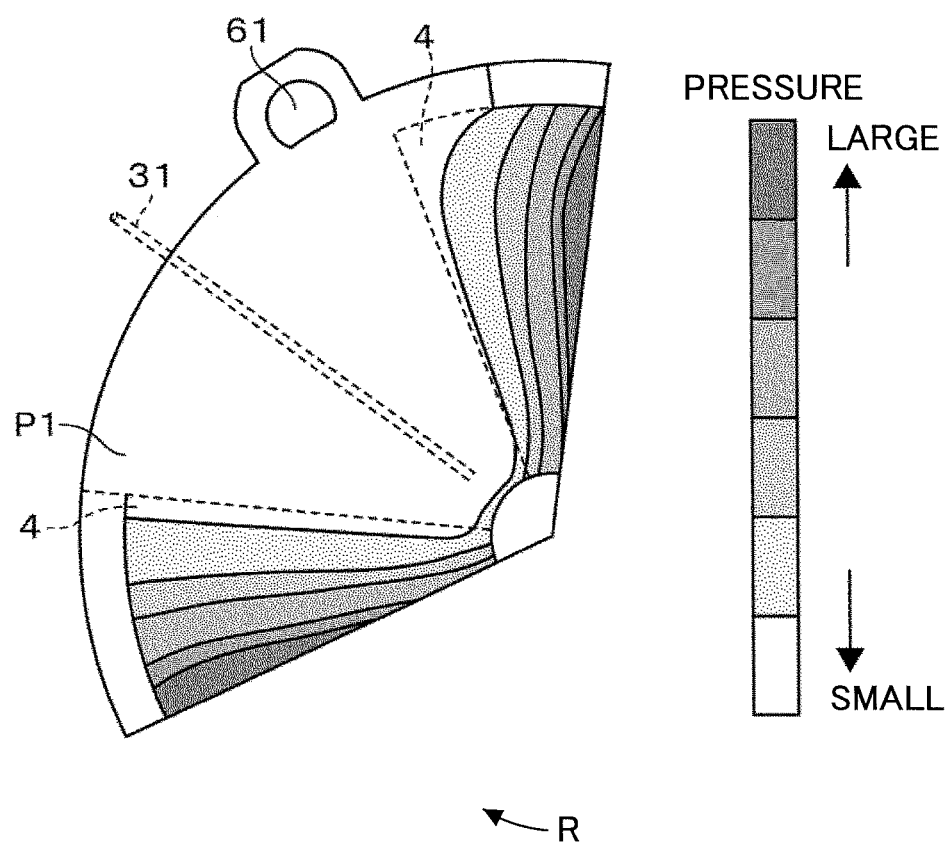
FIG. 25 is a plan view showing pressure distribution of relative example 1c.
Figure 26:
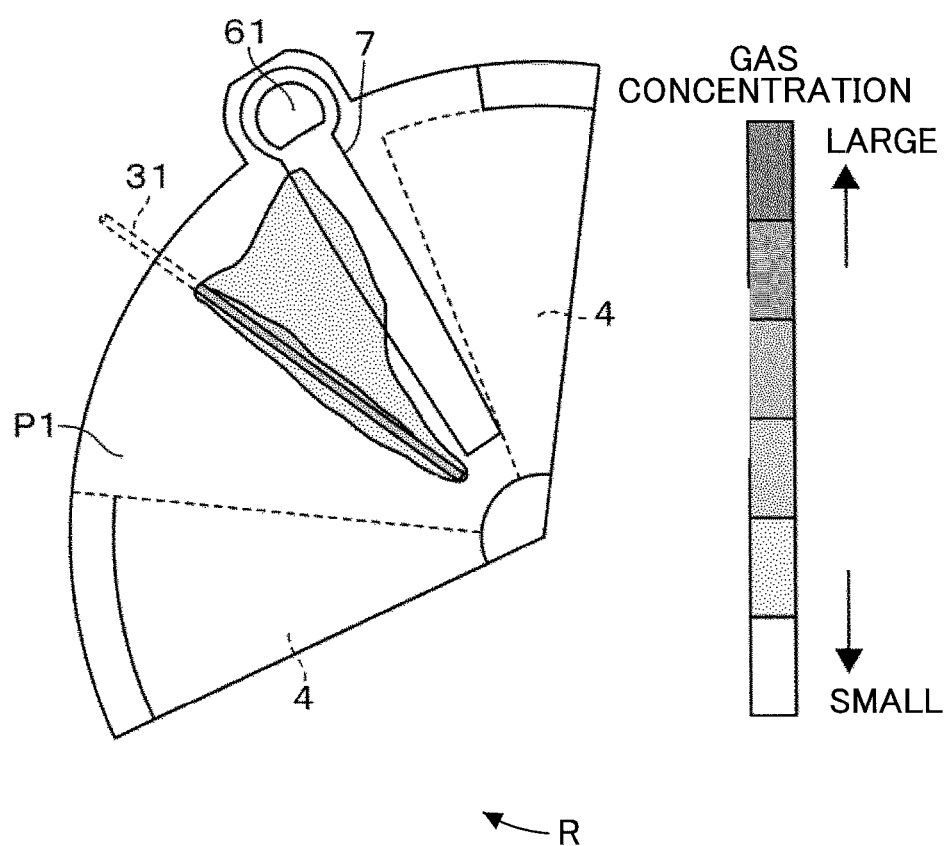
FIG. 26 is a plan view showing gas diffusion of example 1b.
Figure 27:
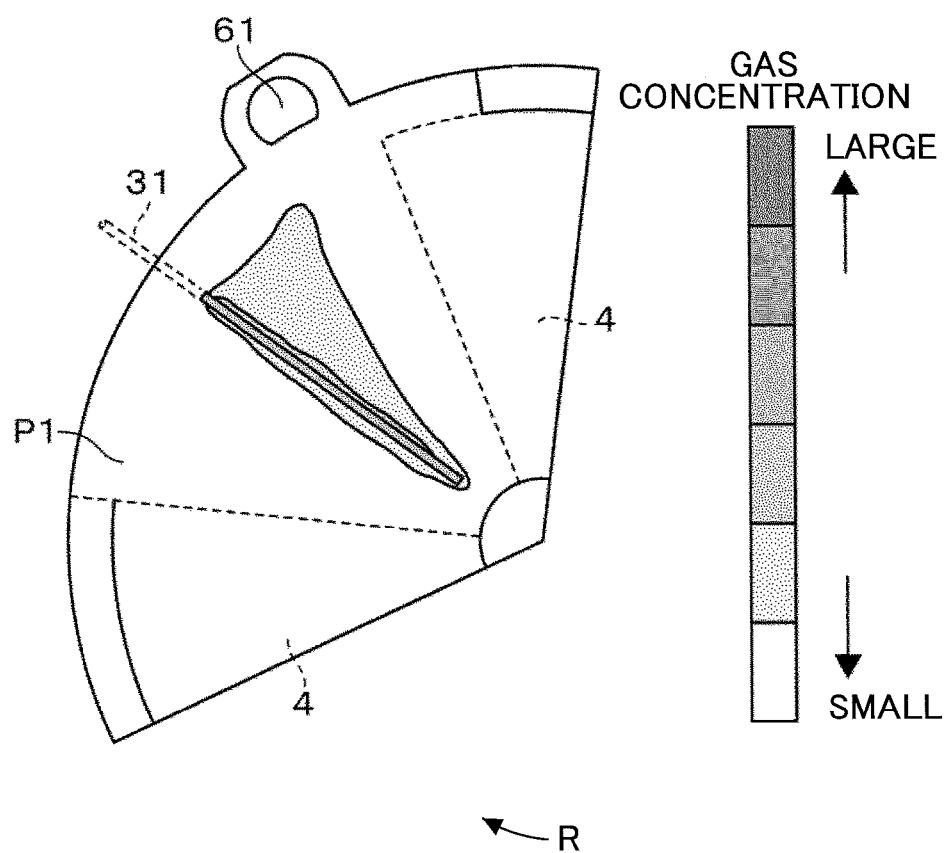
FIG. 27 is a plan view showing gas diffusion of relative example 1c.
Figure 28:
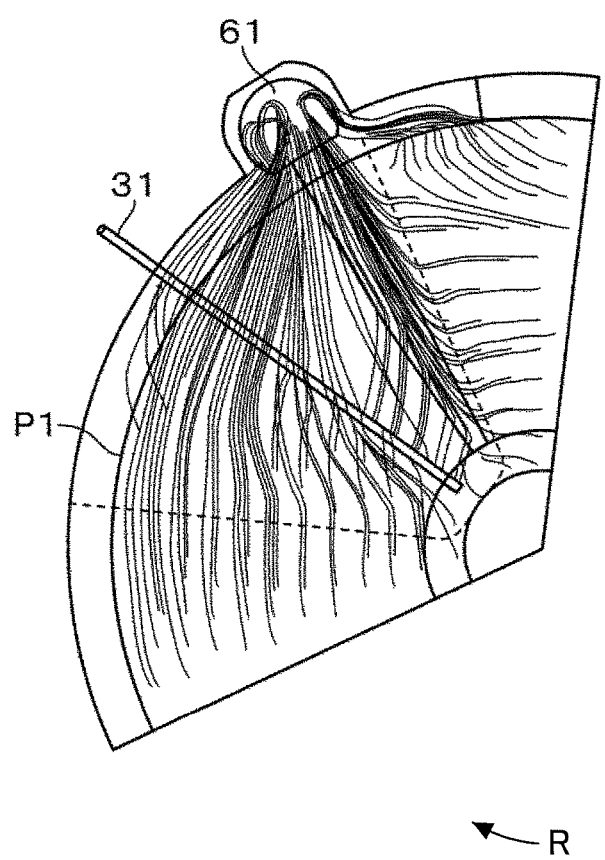
FIG. 28 is a plan view showing gas flow paths of example 1b.
Figure 29:
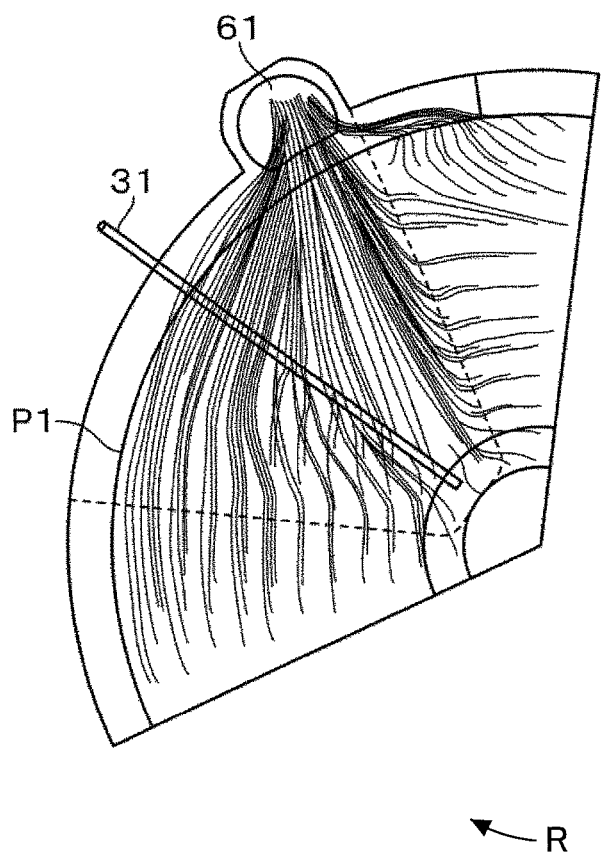
FIG. 29 is a plan view showing gas flow paths of relative example 1c.

The evaluations are performed for a case where the evacuation duct 7 is provided (example 1b), and a case where the evacuation duct 7 is not provided (relative example 1c). For the simulation result of the pressure distribution, FIG. 24 shows a result of example 1b and FIG. 25 shows a result of relative example 1c. For the simulation result of the diffusion of the first process gas, FIG. 26 shows a result of example 1b and FIG. 27 shows a result of relative example 1c. For the simulation result of the flow path of the first process gas, FIG. 28 shows a result of example 1b and FIG. 29 shows a result of relative example 1c.

As a result, for example 1b, compared with relative example 1c, more areas with a higher pressure exist, diffusion area of the first process gas is larger and the first process gas flows in the rotational direction R of the turntable 2. By providing the evacuation duct 7, the process gas flows in the rotational direction R and the process gas is evacuated while spreading in a large area to generate many higher pressure areas.

(Simulation 2)

A simulation analysis of the processing area P1 of the film deposition apparatus 10 shown in FIG. 1 for pressure distribution and diffusion of the first process gas under the analysis condition same as that of the simulation 1 (although the rotational speed of the turntable 2 is 240 rpm) is performed.

The opening condition of the first gas evacuation opening portion 73 and the second gas evacuation opening portion 79 are set as follows.

Example 2

All of the slits (the slits 73a, the slits 73b, the slits 76a, the slits 76b and the slits 74) of the evacuation duct 7 and the opening portion 75 are opened.

Example 3

The slits 76b of the second side wall 722 (facing the separation area D1) of the elongating member 72 are closed.

Example 4

The slits 76b of the second side wall 722 (facing the separation area D1) and the slits 74 of the bottom portion 724 of the elongating member 72 are closed.

Figure 30:
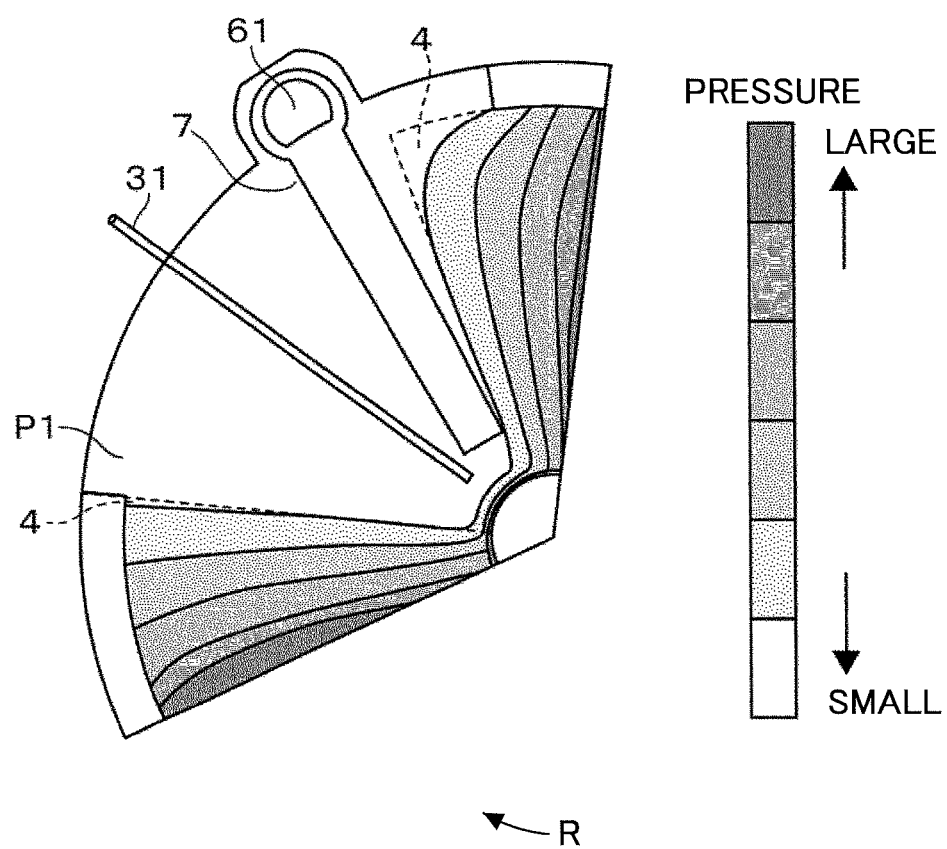
FIG. 30 is a plan view showing pressure distribution of example 2.
Figure 31:
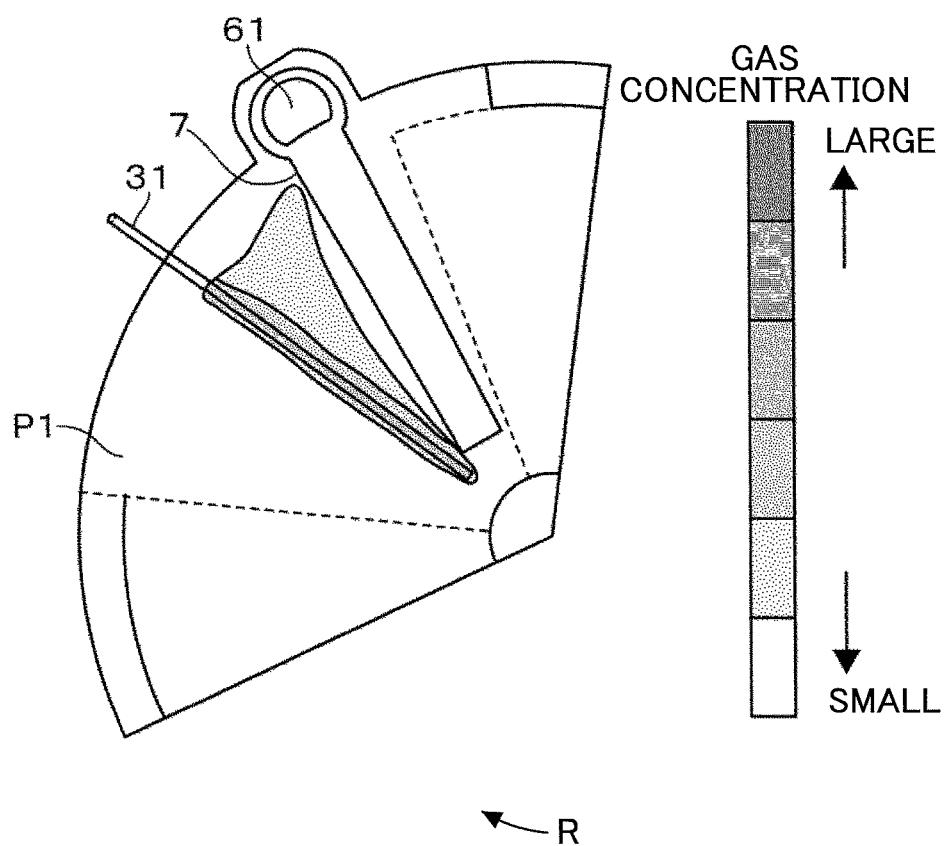
FIG. 31 is a plan view showing gas diffusion of example 2.
Figure 32:
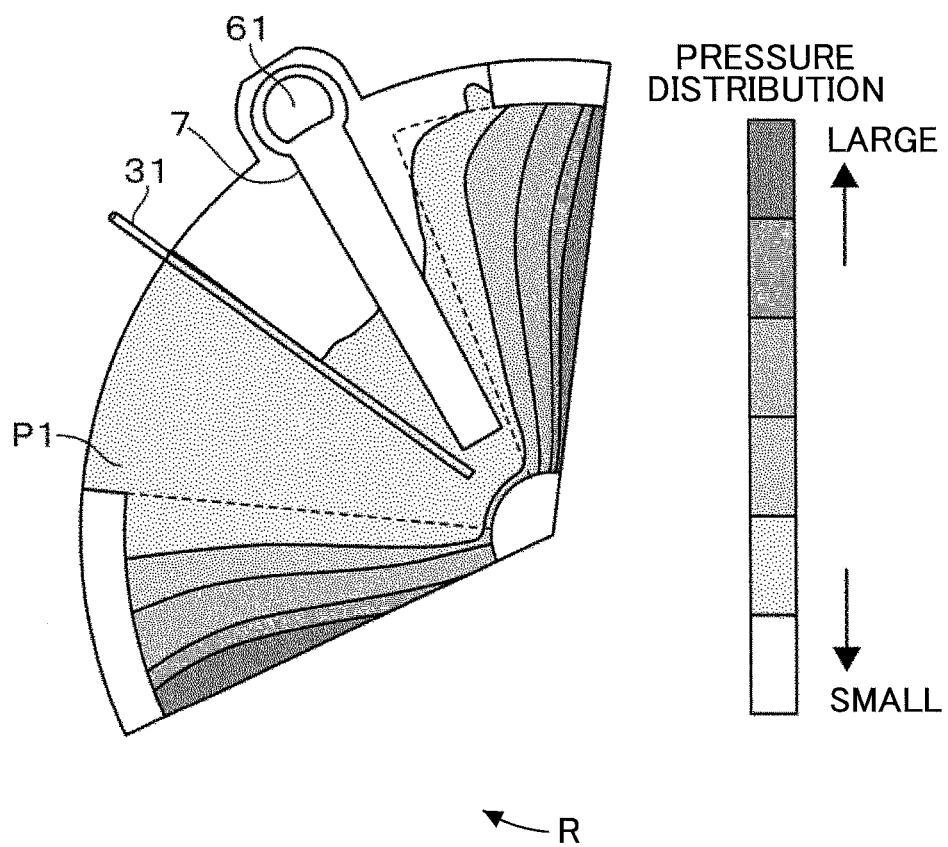
FIG. 32 is a plan view showing pressure distribution of example 3.
Figure 33:
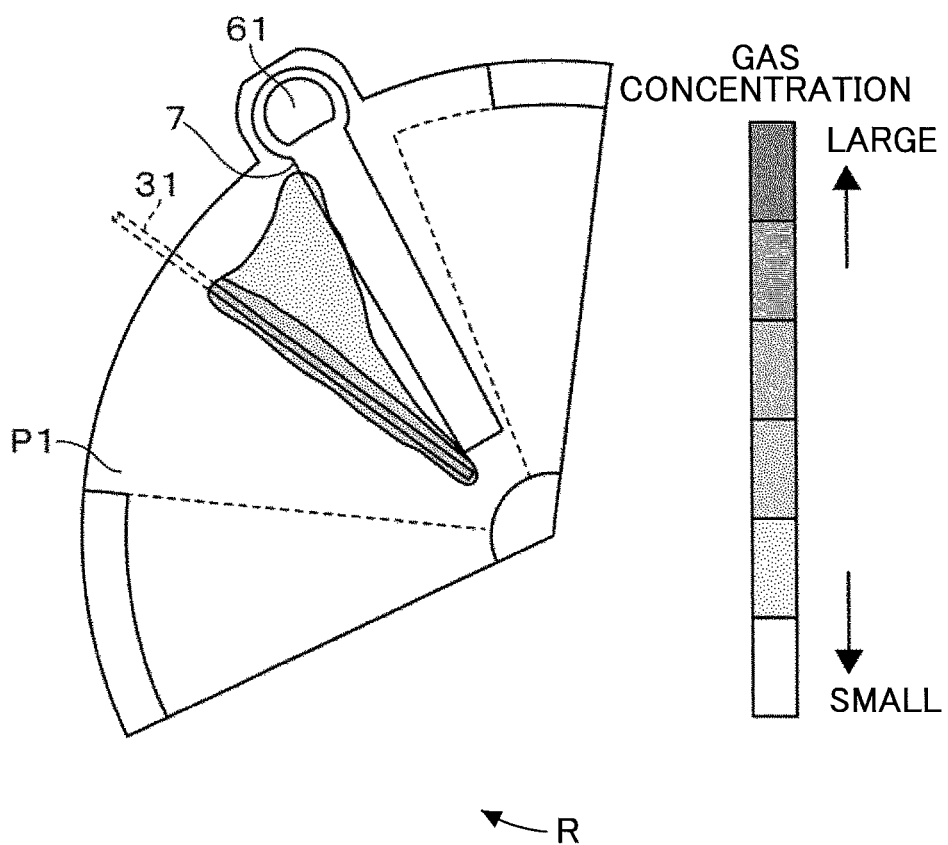
FIG. 33 is a plan view showing gas diffusion of example 3.
Figure 34:
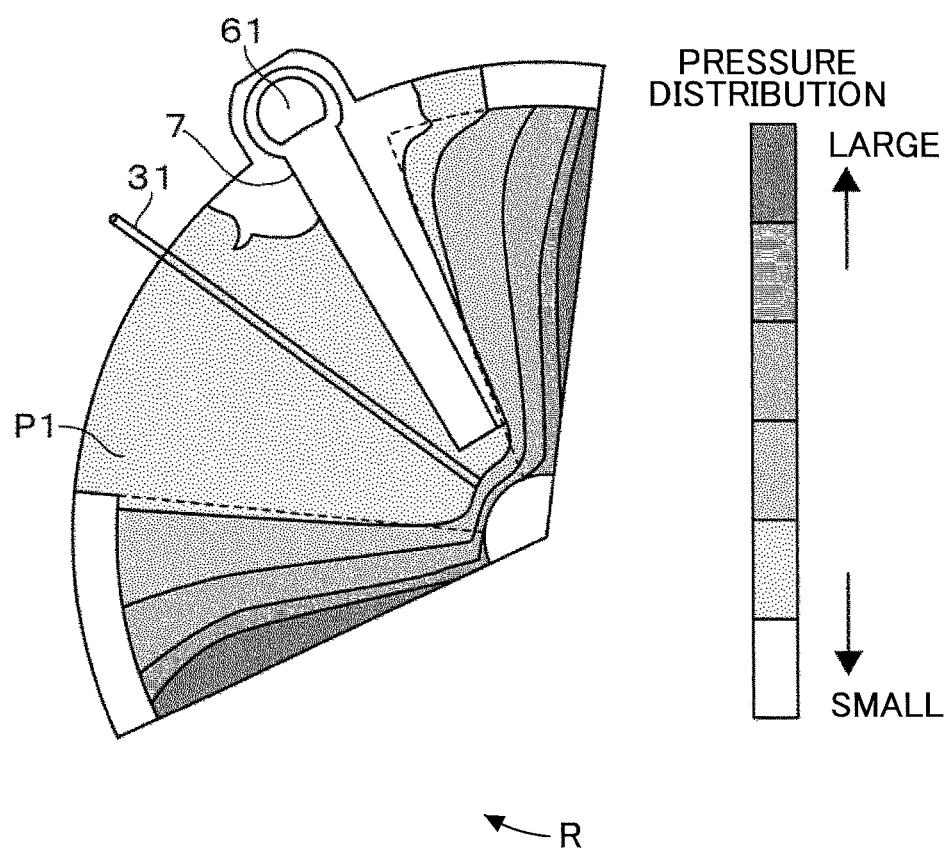
FIG. 34 is a plan view showing pressure distribution of example 4.
Figure 35:
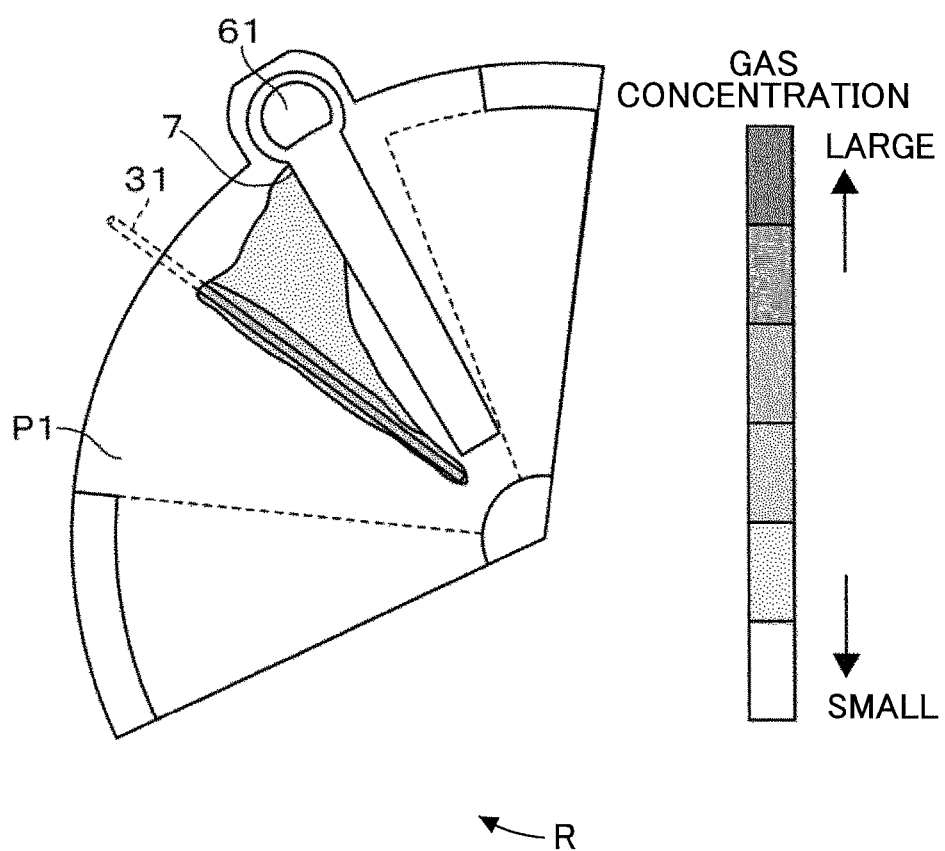
FIG. 35 is a plan view showing gas diffusion of example 4.

For the simulation result of example 2, FIG. 30 shows a result of pressure distribution and FIG. 31 shows a result of diffusion of the first process gas. For the simulation result of example 3, FIG. 32 shows a result of pressure distribution and FIG. 33 shows a result of diffusion of the first process gas. For the simulation result of example 4, FIG. 34 shows a result of pressure distribution and FIG. 35 shows a result of diffusion of the first process gas.

From these various results, it is revealed that the pressure distribution and diffusion of the first process gas in the vacuum chamber 1 vary by opening and closing slits to change the positions of the second gas evacuation opening portion 79. Thus, it can be understood that by changing the positions of the second gas evacuation opening portion 79 in the longitudinal direction of the evacuation duct 7, the evacuating power is changed to change the flow of the first process gas to further change the pressure distribution or distribution condition. Further, for example 4 in which the percentage of the closed slits near the first gas evacuation port 61 is the largest, it is revealed that the first process gas spreads more compared with example 2 and example 3. With this structure, it can be understood that the first process gas can be widely spread by adjusting the position or the like of the gas evacuation opening portion such that the gasses are absorbed from the front end side of the evacuation duct 7.

According to the embodiment, when forming films by supplying one or more process gasses onto wafers W on a turntable while rotating the turntable, a regulation member is provided to at least one of processing areas. Thus, the process gas from the process gas nozzle corresponding to the processing area where the regulation member is provided can be supplied with a high uniformity in the radius direction of the turntable. Therefore, the process of forming a film with a high in-plane uniformity can be performed.

The following embodiments may also be included.

There is provided a film deposition apparatus in which a cycle of supplying plural kinds of process gasses onto a substrate in order in a vacuum chamber is repeated plural times to form a thin film, including, a turntable provided in the vacuum chamber and including substrate placing areas formed at the upper surface for placing substrates in the circumferential direction for revolving the substrate placing areas, plural processing areas provided in the circumferential direction of the turntable for processing the substrates by gasses different from each other, plural process gas nozzles provided for each of the processing areas to extend from an inner edge to an outer edge of the substrate placing area and provided with plural gas supplying ports for supplying the respective process gasses formed in the longitudinal direction, separation areas to each of which a separation gas is supplied from a separation gas supplying unit and provided between the processing areas for separating atmospheres of the plural processing areas, plural gas evacuation ports provided for each of the processing areas to be positioned downstream of the respective process gas nozzle in the rotational direction of the turntable and outside of the circumference of the turntable for evacuating the process gas and separation gas, and an evacuation member provided at least at one of the plural processing areas, and including a hollow member extending from the inner edge to the outer edge of the substrate placing area between the process gas nozzle and the downstream separation area to cover the respective gas evacuation port, wherein the evacuation member is provided with a first gas evacuation opening portion at the outside of the circumference of the turntable, and a second gas evacuation opening portion at least at the inner edge of the substrate placing area.

Further, there is provided a film deposition apparatus in which a cycle of supplying plural kinds of process gasses onto a substrate in order in a vacuum chamber is repeated plural times to form a thin film, including, a turntable provided in the vacuum chamber and including substrate placing areas formed at the upper surface for placing substrates in the circumferential direction for revolving the substrate placing areas, plural processing areas provided in the circumferential direction of the turntable for processing the substrates by gasses different from each other, plural process gas nozzles provided for each of the processing areas to extend from an inner edge to an outer edge of the substrate placing area and provided with plural gas supplying ports for supplying the respective process gasses formed in the longitudinal direction, separation areas to each of which a separation gas is supplied from a separation gas supplying unit and provided between the processing areas for separating atmospheres of the plural processing areas, plural gas evacuation ports provided for each of the processing areas to be positioned downstream of the respective process gas nozzle in the rotational direction of the turntable and outside of the circumference of the turntable for evacuating the process gas and separation gas, and a regulation member provided at least at one of the plural processing areas, and including a plate-shaped member extending from a side of the respective gas evacuation port to the inner edge of the substrate placing area between the process gas nozzle and the respective gas evacuation port while having a space with the turntable, wherein the regulation member regulates the flow of the process gas such that the process gas supplied from the respective process gas nozzle passes below the regulation member to be directed to the gas evacuation port.

Although a preferred embodiment of the regulation member has been specifically illustrated and described, it is to be understood that minor modifications may be made therein without departing from the sprit and scope of the invention as defined by the claims.

The present invention is not limited to the specifically disclosed embodiments, and variations and modifications may be made without departing from the scope of the present invention.

What is claimed is:

1. A film deposition apparatus in which a gas is supplied onto a substrate in a vacuum chamber to form a film on the substrate, comprising:

a turntable provided in the vacuum chamber, including plural substrate placing areas formed at a surface of the turntable for placing substrates in the circumferential direction of the turntable configured to be rotated to rotate the substrate placing areas;

a gas nozzle provided to extend from an inner edge to an outer edge of the substrate placing area, and provided with plural gas supplying ports along a longitudinal direction of the gas nozzle for supplying gas;

a gas evacuation port provided outside of an outer edge of the turntable and downstream in a rotational direction of the turntable with respect to the gas nozzle for evacuating the gas; and a regulation member including a wall portion provided between the gas nozzle and the gas evacuation port and isolating the gas nozzle and the gas evacuation port at least at a part between the inner edge to the outer edge of the substrate placing area while having a space extending from the inner edge to the outer edge of the substrate placing area even when a substrate is placed on the substrate placing area; wherein the regulation member includes a first side wall including the wall portion to extend from inner edge to the outer edge of the substrate placing area, and is provided with an opening portion for evacuating a gas to the gas evacuation port.

2. The film deposition apparatus according to claim 1, wherein the opening portion of the first side wall is selectively provided at the outer edge of the substrate placing area.

3. The film deposition apparatus according to claim 1, wherein the opening portion of the first side wall is selectively provided at the inner edge of the substrate placing area.

4. The film deposition apparatus according to claim 1, further comprising a mask member that selectively masks a part of the opening portion provided at the first side wall.

5. The film deposition apparatus according to claim 1, wherein the wall portion is provided to be in parallel relationship with the gas supplying ports of the gas nozzle.

6. The film deposition apparatus according to claim 1, wherein the regulation member includes an elongating member that includes, a first side wall configured to include the wall portion to extend from the inner edge to the outer edge of the substrate placing area, a second side wall configured to extend from the inner edge to the outer edge of the substrate placing area and be positioned downstream of the first side wall in the rotational direction of the turntable to face the first side wall, and an upper portion configured to extend from the inner edge to the outer edge of the substrate placing area over the gas evacuation port and be positioned at upper surfaces of the first side wall the second side wall.

7. The film deposition apparatus according to claim 6, wherein opening portions are provided at the first side wall and the second side wall, respectively.

8. The film deposition apparatus according to claim 7, wherein each of the opening portions includes plural slits aligned in the longitudinal direction of the elongating member.

9. The film deposition apparatus according to claim 6, wherein the elongating member includes a bottom portion configured to extend from the inner edge to the outer edge of the substrate placing area at lower surfaces of the first side wall the second side wall and an opening portion for evacuating a gas into the gas evacuation port.

10. The film deposition apparatus according to claim 9, wherein the opening portion of the bottom portion of the elongating member includes plural slits aligned in the longitudinal direction of the elongating member.

11. The film deposition apparatus according to claim 9, wherein the opening portion of the bottom portion is formed such that the opening area becomes larger closer to the inner edge of the substrate placing area.

12. The film deposition apparatus according to claim 6, wherein the regulation member includes a gas evacuation port cover member configured to cover the gas evacuation port to be provided outside of the circumference of the turntable and in communication with the elongating member, the gas evacuation port cover member being provided with an opening portion for evacuating the gas into the gas evacuation port.

13. The film deposition apparatus according to claim 1, wherein the film deposition apparatus forms the film by repeatedly performing a cycle by which plural kinds of process gasses are supplied onto the substrate in the vacuum chamber.

\* \* \* \* \*